(12) United States Patent  
Parker et al.

(10) Patent No.: US 6,617,587 B2  
(45) Date of Patent: Sep. 9, 2003

(54) ELECTRON OPTICS FOR MULTI-BEAM ELECTRON BEAM LITHOGRAPHY TOOL

(75) Inventors: N. William Parker, Fairfield, CA (US); Alan D. Brodie, Palo Alto, CA (US); George Xinsheng Guo, Los Altos Hills, CA (US); Edward M. Yin, Cupertino, CA (US); Michael C. Matter, Sunnyvale, CA (US)

(73) Assignees: Multibeam Systems, Inc., Santa Clara, CA (US); Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/243,585

(22) Filed: Sep. 12, 2002

(65) Prior Publication Data

US 2003/0085360 A1 May 8, 2003

Related U.S. Application Data

(63) Continuation of application No. 09/722,079, filed on Nov. 23, 2000, now abandoned.
(60) Provisional application No. 60/167,442, filed on Nov. 23, 1999.

(51) Int. Cl.[7] ............................................. H01J 37/147
(52) U.S. Cl. ................. 250/398; 250/396 R; 250/492.2
(58) Field of Search ............................. 250/396 R, 398, 250/492.2

(56) References Cited

U.S. PATENT DOCUMENTS 5,430,292 A * 7/1995 Honjo et al. ............. 250/492.2  
5,981,962 A * 11/1999 Groves et al. ............. 250/398

* cited by examiner

Primary Examiner—Jack Berman  
(74) Attorney, Agent, or Firm—David Jaffer; Pillsbury Winthrop LLP

(57) ABSTRACT

A charge particle optical column capable of being used in a high throughput, mutli-column, multi-beam electron beam lithography system is disclosed herein. The column has the following properties: purely electrostatic components; small column footprint (20 mm square); multiple, individually focused charge particle beams; telecentric scanning of all beams simultaneously on a wafer for increased depth of field; and conjugate blanking of the charged particle beams for reduced beam blur. An electron gun is disclosed that uses microfabricated field emission sources and a microfabricated aperture-deflector assembly. The aperture-deflector assembly acts as a perfect lens in focusing, steering and blanking a multipicity of electron beams through the back focal plane of an immersion lens located at the bottom of the column. Beam blanking can be performed using a gating signal to decrease beam blur during writing on the wafer.

6 Claims, 23 Drawing Sheets

(drawing is not to scale)

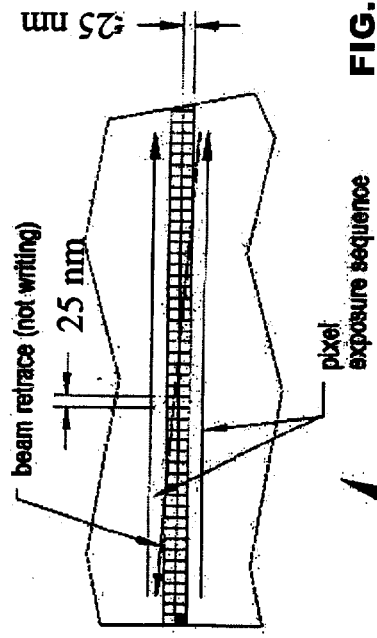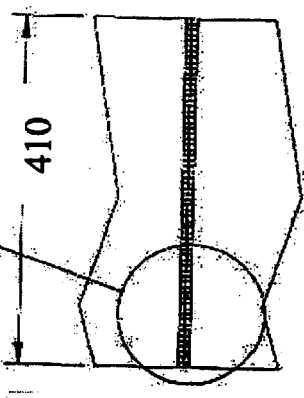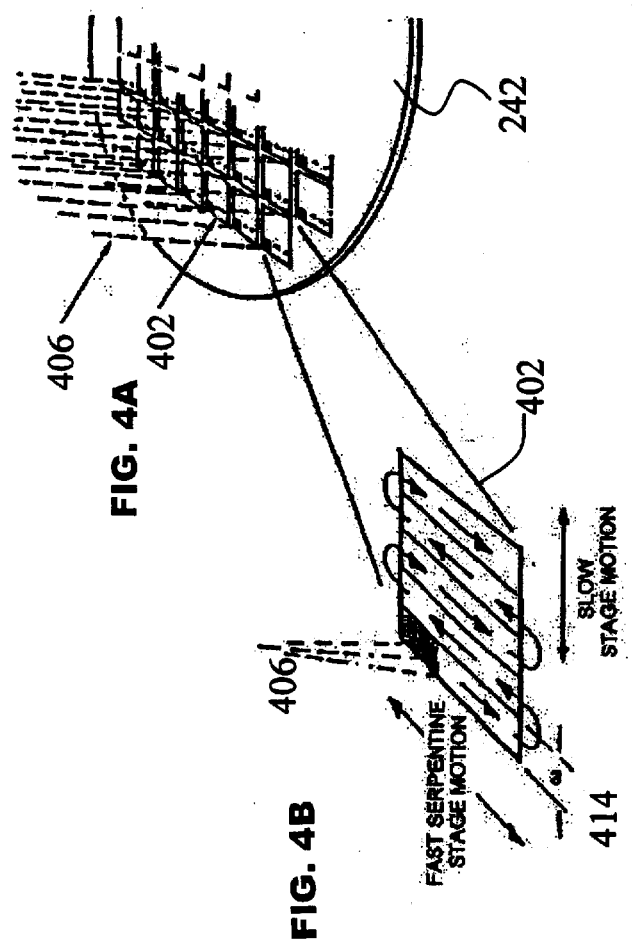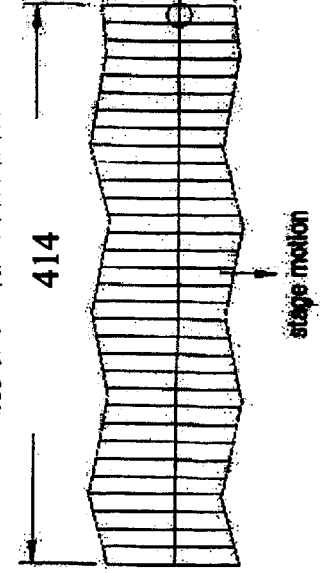
FIG. 4A
FIG. 4B
FIG. 4C
FIG. 4D
FIG. 4E

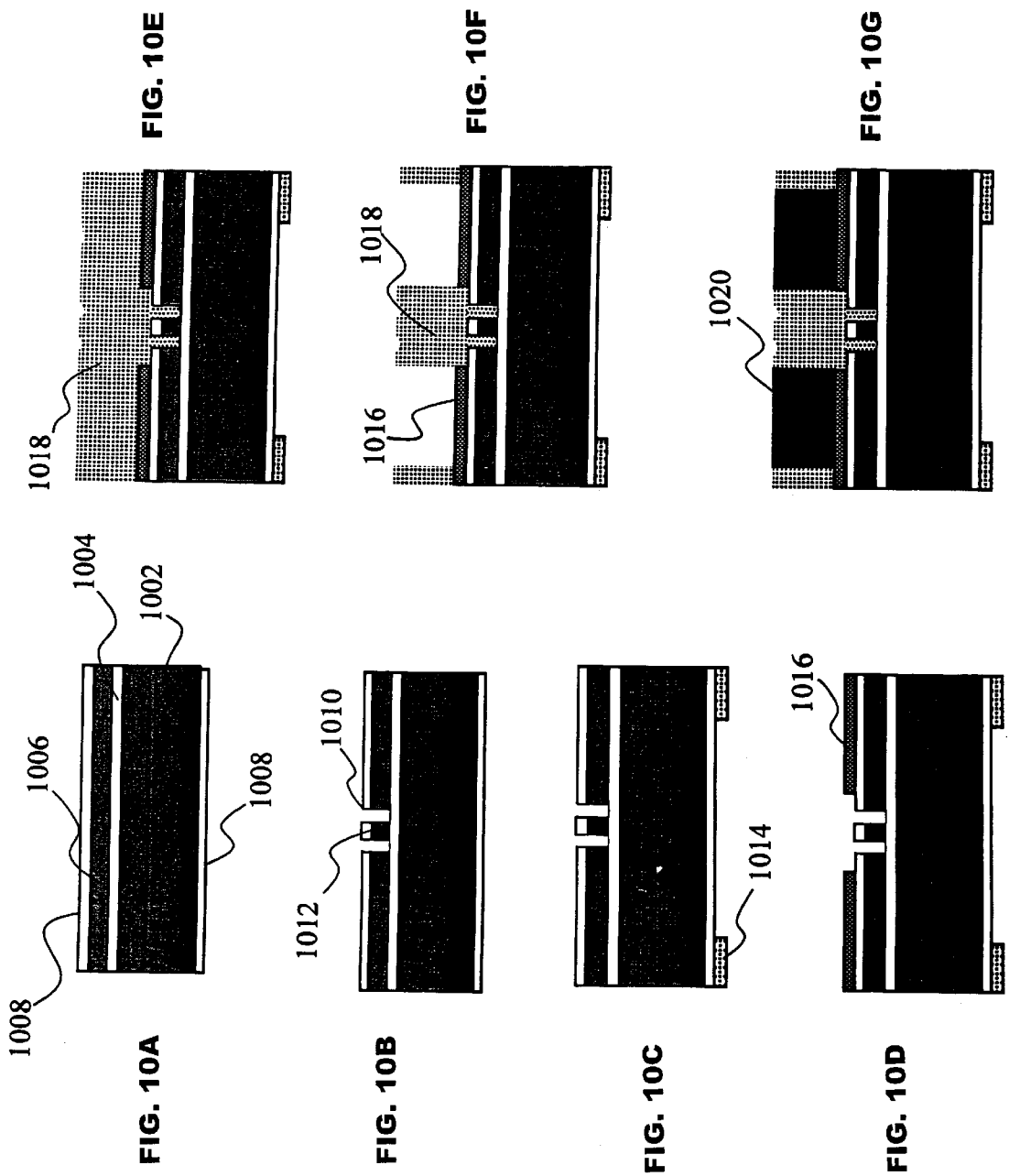

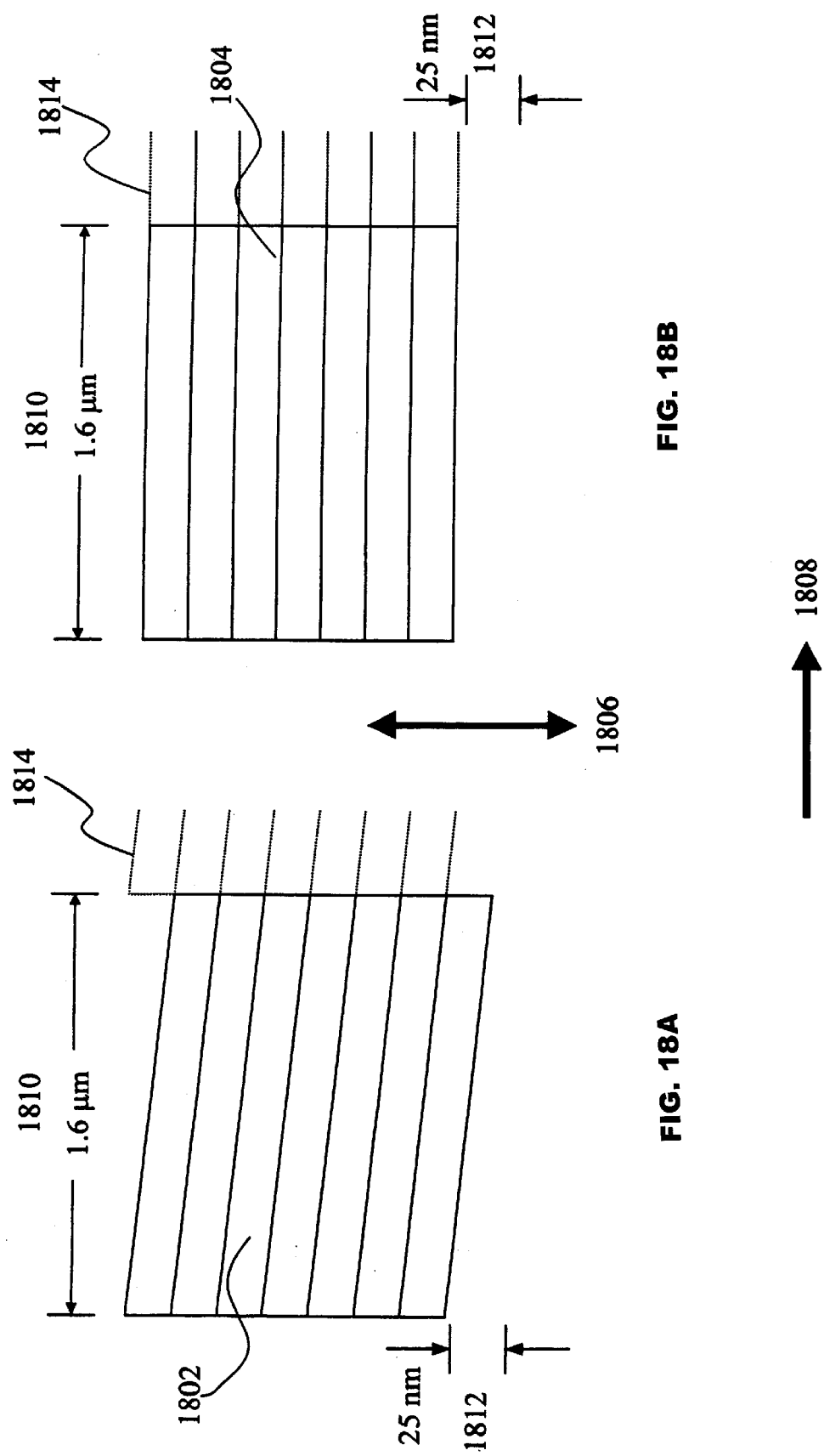

ELECTRON OPTICS FOR MULTI-BEAM ELECTRON BEAM LITHOGRAPHY TOOL

CROSS-REFERENCE TO RELATED APPLICATIONS

This application is a continuation of U.S. patent application Ser. No. 09/722,079 filed Nov. 23, 2000, which claims the benefit of U.S. Provisional Application No. 60/167,442 filed Nov. 23, 1999.

BACKGROUND OF THE INVENTION

1. Field of the Invention

This invention relates to the field of lithography, and in particular to lenses and other column components, suitable for use in charged particle beam direct-write lithography.

2. Description of the Related Art

At present, there is no practical solution for next generation lithography (NGL) at the ITRS 70 nm resolution node. The leading NGL contenders—Extreme Ultraviolet Lithography, Electron Projection Lithography, X-Ray Lithography and Ion Projection Lithography—all use masks. NGL masks are difficult to fabricate and expensive; and many lithography masks are required for standard IC chips, and in particular for microprocessor chips. The latest Pentium III microprocessor requires approximately 30 masks. These mask costs must be amortized into the cost of fabricating the IC chips. Electron beam direct-write (EBDW) systems offer two particular advantages over other NGL technologies: (1) they are maskless, thus eliminating mask amortization costs and expediting chip development cycles; (2) they have the capabilities of meeting all future ITRS nodes in terms of resolution (out to critical dimensions of 25 nm). The primary disadvantage of the traditional single column and probe-forming or shaped-beam systems is wafer throughput limitation due to space-charge effects. Space-charge effects are electron-electron interactions that occur when there are regions within the column with high electron beam current density. These effects tend to blur the beam and increase the spot size on the wafer. Since most electron optical column designs have a crossover, in which all of the electrons pass through a small area, the current density becomes quite large. In order to achieve writing resolution of less than 50 nm, electron beam currents need to be limited to roughly 1 $\mu$A through a crossover. For a 300 mm diameter wafer and a 10 $\mu$C/cm$^2$ resist sensitivity, a simple calculation shows that an electron beam current of roughly 80 $\mu$A is required to expose the entire wafer in a time of 90 seconds. Including a writing overhead of 30 seconds, this results in a wafer writing throughput of 30 wafers/hr, which barely meets the chip manufacturers' throughput requirements. A more sensitive resist can be used, but then statistical dose issues become a concern. As can be seen, this amount of electron beam current (80 $\mu$A) is much too high to be used in a single column approach with high resolution. In order to keep the column current to less than 1 $\mu$A/column, a minimum of 80 beams that do not interact with each other are needed. Thus, a multi-beam approach is required.

The straightforward technique to reduce space-charge effects is to spread the current over the wafer by using multiple beams that write simultaneously. Some have proposed multi-beam systems using multiple columns and only a single beam per column, such as Chang, et al. [T. H. P. Chang, D. P. Kern, and L. P. Murray, J. Vac. Sci. Tech. B 10(6), pp. 2743 (1992)] and Groves and Kendall [T. R. Groves and R. A. Kendall, J. Vac. Sci. Technol. B 16(6), 3168, (1998)]. Others, such as Yasuda [H. Yasuda et al., J. Vac. Sci. Technol. B 14(6), 3813 (1996)] and Schneider [J. E. Schneider, P. Sen, D. S. Pickard, G. I. Winograd, M. A. McCord, R. F. W. Pease, W. E. Spicer, A. W. Baum, K. A. Costello, and G. A. Davis., J. Vac. Sci. Technol. B 16(6), 3192 (1998)] propose using multiple beams within a single column. However, these approaches run into another major problem for EBDW systems: data rate. Because the data rate is applied serially to each writing beam, extremely high data rates are required for typical EBDW systems. Assuming that each beam is blanked individually, the data transfer rate of the pattern onto the wafer can be calculated, and from this calculation, we determine an appropriate number of beams required. For a 300 mm wafer with 25 nm×25 nm pixels, there are a total of 1.1×10$^{14}$ pixels on the entire wafer. In order to write the wafer in 90 seconds, an overall data rate of 1.26×10$^{12}$ pixels/s is required. Blanking rates on the order of 100–300 MHz are presently achievable. Therefore, the minimum number of beams that satisfy the blanking rate requirement is between 4,000 and 12,000. With a practical blanking rate of 250 MHz per beam, roughly 6000 individually controllable beams are required. An approach having 6000 columns per wafer, or 6000 beams per column is not realistic, both in terms of fabrication and electrical interconnects. A multiple column approach, with each column having multiple beams, would solve this problem.

To achieve a compact design with multiple beams per column in a multiple column system is quite challenging. To focus an electron beam to high resolution, without aberrations that cause degradation in the beam shape and size, requires a uniform electrostatic or magnetic field. This level of field uniformity is typically achieved only if the diameter of the electrostatic lens bore is roughly 10 to 100 times larger than the diameter of the electron beam passing through the middle of the lens. Because electron optic imaging systems typically also have a large demagnification factor, this results in a writing field of view on the wafer that is much smaller than the lens diameter. For example, if the writing area required on the wafer is roughly 250 $\mu$m, and the demagnification of the imaging system is roughly 1/50×, then the lens bore diameter must be in the range of 125 mm to 1.25 m in diameter in order to minimize aberrations. Since the wafer diameter itself is only 300 mm, this standard electrostatic lens cannot be used in a multi-column approach. A more compact lens design that can individually focus multiple beams within a single compact column design would overcome this problem.

SUMMARY OF THE INVENTION

This invention includes lenses and other column components, suitable for use in multiple charged particle beam systems, and particularly in multiple column, multiple charged particle beam systems. According to aspects of this invention, an integrated optical element for independent alignment of multiple charged particle beams comprises: a substrate for providing structural support with a multiplicity of apertures and a multiplicity of independently addressable alignment deflectors situated over insulating material of the substrate, such that each of the deflectors is positioned over a corresponding substrate aperture. Further, a multiplicity of object apertures can be situated over the deflectors, such that each object aperture is positioned over and electrically isolated from a corresponding deflector. Furthermore, a multiplicity of independently addressable blankers can be situated over the deflectors, such that each blanker is positioned over and electrically isolated from a corresponding deflector. Further, a multiplicity of spray apertures can be situated between the substrate and the deflectors, such that each spray aperture is positioned below and electrically isolated from a corresponding deflector. The multiplicity of deflectors can be arranged in a regular array, such as a line. In preferred embodiments the integrated optical element comprises spray apertures, deflectors, object apertures and blankers, as described above, with the blankers situated over the object apertures such that each blanker is positioned over and electrically isolated from a corresponding object aperture.

According to further aspects of the invention, an optical column for multiple charged particle probe generation comprises: a charged particle source for generating a multiplicity of charged particle beams; an integrated optical element for independent alignment of each charged particle beam; an accelerating column; a deflector; a blanking aperture; and an immersion lens. Further, the optical column can include a rotator between the integrated optical element and the accelerating column. The charged particle source can be a multiplicity of field emission cathodes; the source can also be an ion source. The charged particle source and the integrated optical element can be bonded together. The optical column can also include means for gated blanking, electrically connected to the blankers in the integrated optical element.

BRIEF DESCRIPTION OF THE FIGURES

FIG. 4a shows a schematic representation of the column footprint on the wafer, each column having 32 beams.

FIG. 4b shows a magnified view of FIG. 4a, indicating the electronic scanning of the 32 beams of a single column over the column footprint, and the scanning of the stage underneath the column.

FIG. 4c shows a schematic of a single stripe and its decomposition into substripes.

FIG. 4d shows a magnified view of FIG. 4c, indicating a single substripe and its decomposition into writing pixels.

FIG. 4e shows a magnified view of FIG. 4d, indicating the pixel exposure sequence across a single substripe.

FIG. 18a shows a schematic cross-section of an on-axis beamlet being focused by the immersion lens onto the wafer.

FIG. 18b shows a schematic cross-section of an off-axis beamlet being focused by the immersion lens onto the wafer.

DETAILED DESCRIPTION

Consider a multiple column, multiple beam electron beam lithography system. This system has the advantages of maskless lithography, while overcoming the two fundamental limits of typical electron beam direct-write (EBDW) systems: space charge effects and high data rates. Space charge effects are overcome by introducing multiple columns that write simultaneously and spread the electron beam current over the entire wafer. By eliminating space charge effects, small writing spot sizes can be achieved. The data rate problem is overcome by introducing multiple beams per column to allow for a realistically achievable blanking bandwidth for each beam. Hence, EBDW in a multicolumn, multibeam system can be attractive in terms of high throughput, high resolution and lowered cost of ownership in manufacturing.

The specifications of each electron optical column must first be determined by examining the throughput and data rate requirements. The main factors that determine the minimum number of beams in a multi-electron beam direct-write lithography system with high throughput are the blanking speed and data rate. From the considerations of blanking rate, the minimum number of beams required is 6000. For a 300 mm wafer and 25×25 nm pixels, this corresponds to a wafer throughput of 30 wafers/hour (including overhead), and a blanking rate of 250 MHz. Next, the number of columns must be determined.

There are two main factors that determine the number of columns required: space-charge effects and column footprint. Space-charge effects can become more significant when the column design includes a crossover, as is the case in most single-column, multi-beam approaches. The crossover region, which is a region of high current density, is known to introduce Boersch effect (energy broadening). An optimization of these various parameters leads to a column footprint (i.e., the column dimensions projected into the plane of the wafer) of roughly 20 mm×20 mm, requiring a total number of 201 columns to cover a wafer. The minimum area of the column footprint is presently limited by the number of connections required for each column. Each column has 32 beams, for a total number of 6432 beams. Therefore, each beam must have an average current of roughly 12 nA ($\cong$80 $\mu$A/6432, where 80 $\mu$A is the total current required for a throughput of 30 wafers/hr with a resist sensitivity of 10 $\mu$C/cm$^2$).

Figure 1:
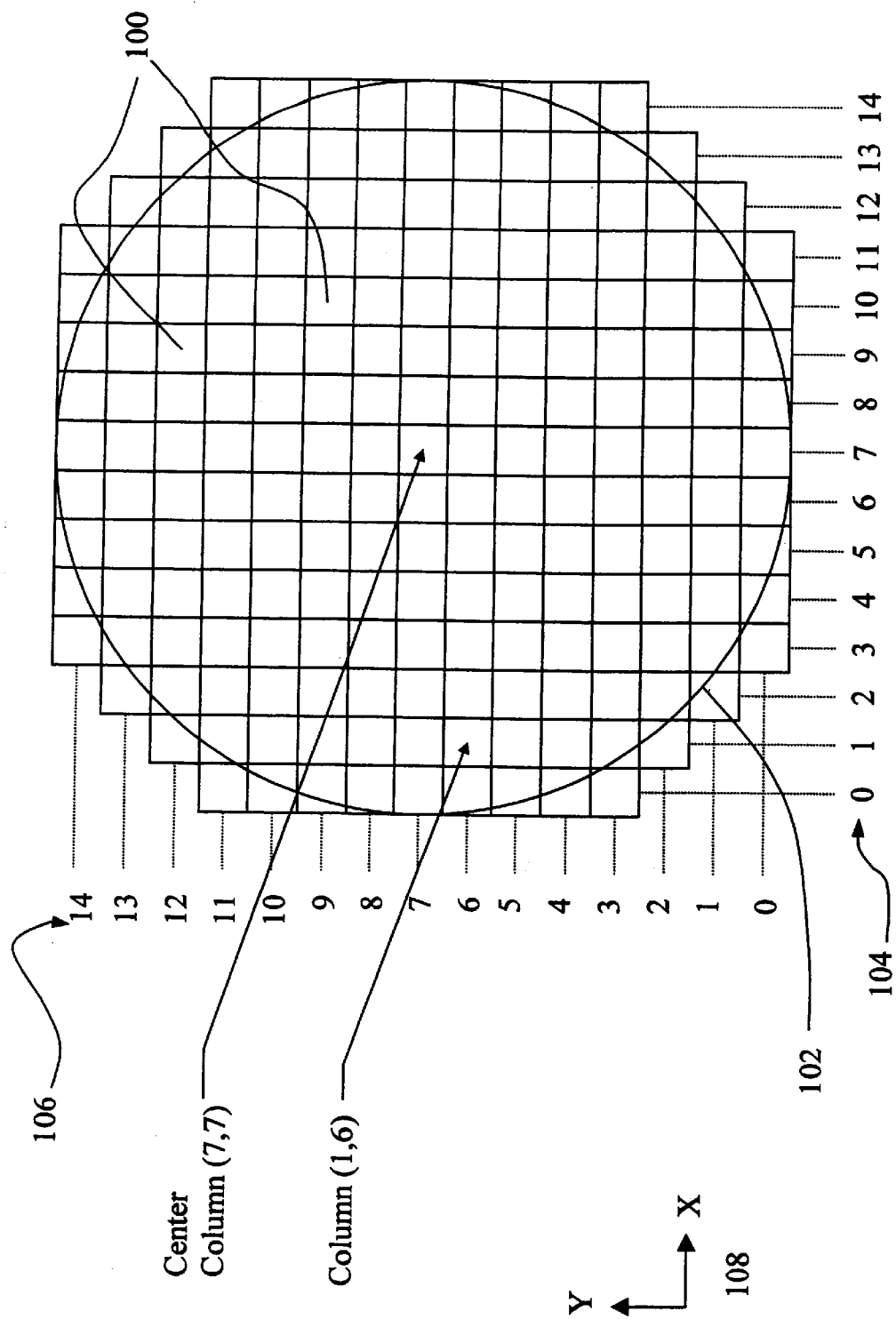
FIG. 1 shows a top plan view schematic of a multi-column layout over a 300 mm wafer within a lithography writing unit.

FIG. 1 shows a schematic of the layout of 201 columns positioned over a 300 mm wafer within the lithography writing head, including the column positions 100, wafer 102, row numbers 104, column numbers 106, and wafer stage axes 108. The lithography writing head is defined as the collection of columns and their associated electronics that are required to write on a 300 mm wafer. As can be seen, the number of columns is derived from a 15×15 array of square columns, each of which has a footprint of 20×20 mm. The 6 columns in each corner are not required because of the round shape of the wafer; hence (15×15)−(6×4)=201 columns. Examples of column notation in terms of rows and columns are given in FIG. 1. The stage axes and how they interact with the writing strategy will be discussed in detail in the Writing Strategy section below. This is one embodiment of the lithography writing head column layout positioned over the wafer 102. Depending on the ease of manufacturability for different column sizes and interconnects, the column footprint area can be adjusted. However, as discussed in the BACKGROUND OF THE INVENTION, a minimum number of roughly 80 columns is required in order to maintain a wafer throughput of 30 wafers/hour with less than 1 $\mu$A per column.

Figure 2:
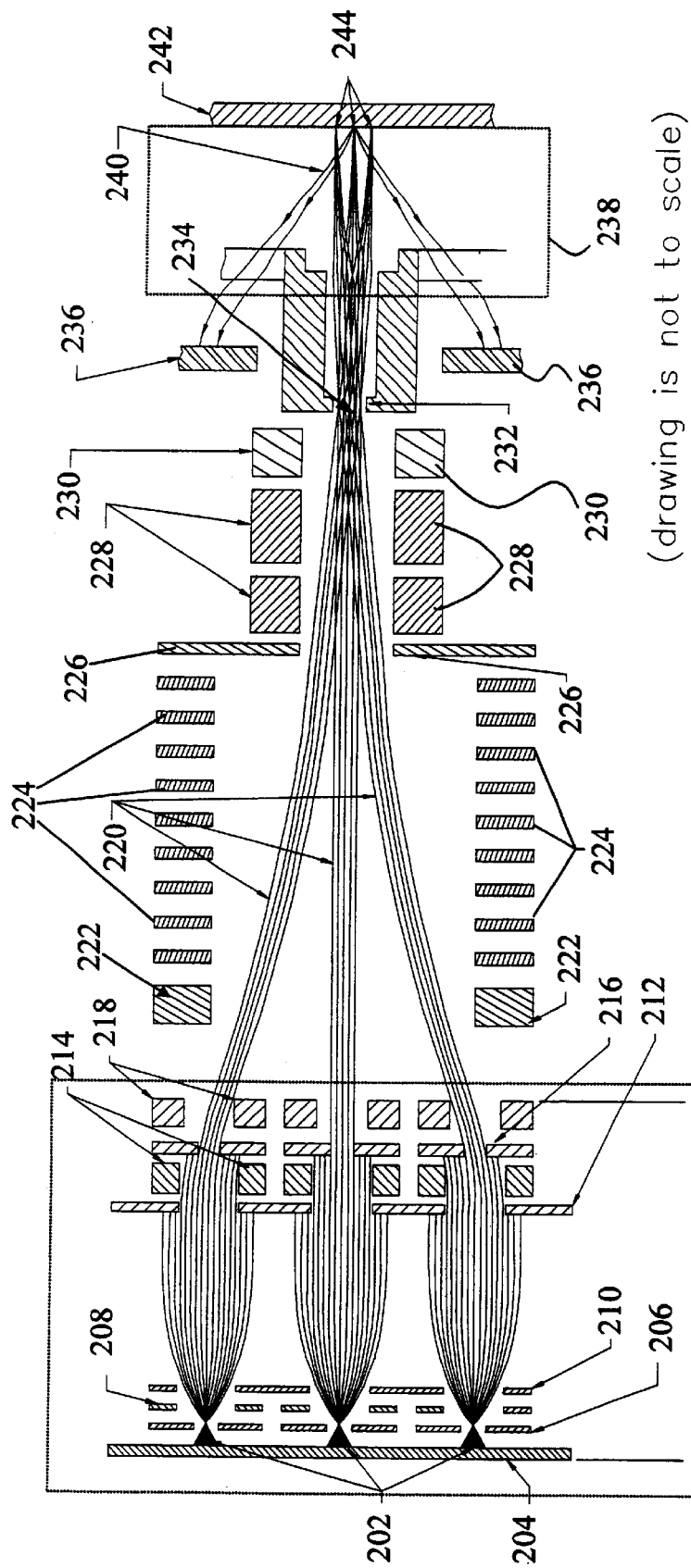
FIG. 2 shows a schematic cross-section of an individual column within a multi-column lithography writing unit.

A schematic of the first embodiment of the invention, which is a single electron optical column to be used in a multicolumn, multibeam lithography system writing head, is shown in FIG. 2. The schematic shows the field emission tips 202, source substrate 204, gate electrodes 206, focus electrodes 208, focus shield electrode 210, spray aperture 212, alignment deflectors 214, object aperture plate 216, blanking electrodes 218, individual beamlets 220, rotator 222, accelerating column plates 224, shield electrode 226, mainfield deflectors 228, subfield deflectors 230, blanking aperture or lens plate 232, blanking aperture 234, backscattered electron (BSE) detectors 236, immersion lens 238, backscattered electrons 240, wafer 242, positions 244 of the beamlets on the wafer, and the electron gun 250. Only 3 out of the 32 electron sources in the preferred embodiment of the invention are shown in FIG. 2. The functionality of each of these electron optical components will be described below.

Figure 3:
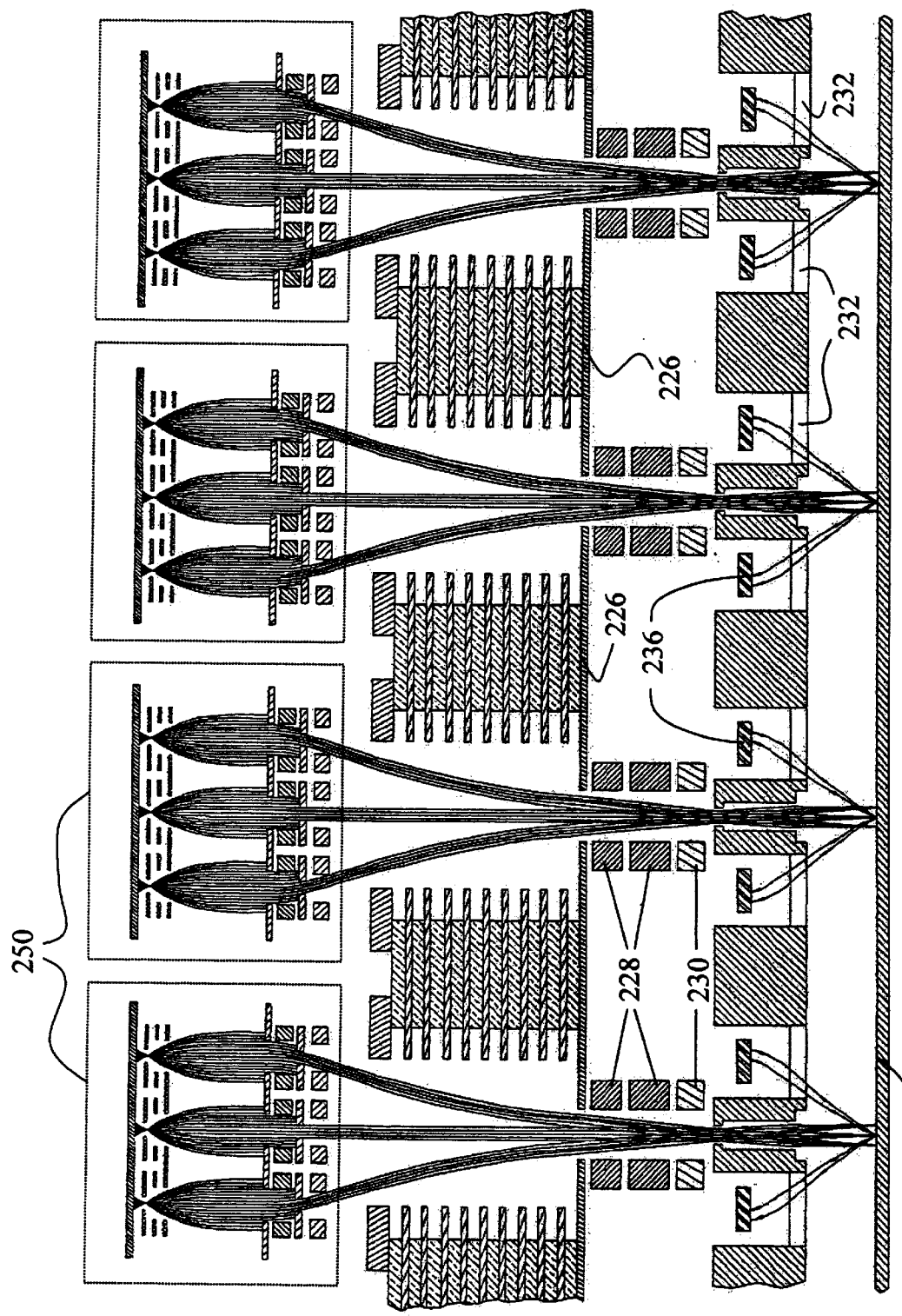
FIG. 3 shows a schematic cross-section of 4 side-by-side columns within a multi-column lithography writing unit.

FIG. 3 shows the placement of 4 adjacent electron columns out of the 201 columns in the lithography writing head, indicating the electron guns 250, mainfield 228 and subfield 230 deflectors, BSE detectors 236, shield electrode 226, lens plate 232 and wafer 242. As can be seen from FIG. 3, in the preferred embodiment of the invention, the electron guns 250, mainfield 228 & subfield 230 deflectors, and BSE detectors 236 are individually controllable within each column. However, the shield electrode 226 and lens plate 232 are common to all of the columns. This reduces the number of interconnects to the writing head.

Referring to FIG. 2, each electron optical column can be broken into 3 main sections: (1) the electron gun 250, consisting of a field emission source 202, focusing optics, alignment deflector optics and blankers 218; (2) the accelerating region and scanning deflectors, consisting of the rotator 222, accelerating plates 224, shield electrode 226, mainfield deflectors 228 and subfield deflectors 230; and (3) the immersion lens 238 and BSE detectors 236. A simplified view of the column operation is as follows. The electron gun 250 creates 32 individually controllable, focused electron beams, precisely steers each beamlet 220 individually down the column through the blanking aperture 234, and individually blanks each beamlet 220 by slightly deflecting it off the blanking aperture 234 and onto the lens plate 232. The accelerating region and deflectors increase the energy of the electron beams and scan all 32 beamlets simultaneously on the wafer 242 to write out the patten input into the blanking electrodes 218. This region is also used to correct for mechanical and stage error, as well as performing some fine focusing adjustment for the 32 beamlets. The immersion lens 238 and BSE detectors 236 provide the primary focusing for all 32 beamlets onto the wafer 242 and detect backscattered electrons 240 that are emitted from the exposed surface. The BSE detectors 236 are used for alignment mark detection and alignment of the beamlets 220 over the wafer 242.

Referring to FIG. 2, the preferred embodiment of the invention is used to create 32 small electron beamlets 220 focused on the wafer 242 for exposure of electron sensitive resist. The 32 beamlets can be blanked and raster scanned over the wafer in order to produce a lithographic pattern within the resist corresponding to the desired IC chip pattern. Along with stage motion, each column writes patterns within a 20 mm×20 mm column footprint area 100 on the wafer 220. With 201 columns simultaneously writing on the wafer 242, the time required to pattern the entire wafer is equivalent to the time required for one column to pattern its own 20×20 mm footprint area 100. The detailed operation of each electron optical component is described in the paragraphs below. In other embodiments of the invention, the number of columns and the number of beams per column can be altered. However, the product of the number of columns and the number of beams per column should be in the range of 4,000 to 12,000.

WRITING STRATEGY—From FIG. 1, it can be seen that for a 300 mm wafer, a total of 201 columns simultaneously write on the surface of the wafer 242. Each column covers an approximately 20 mm×20 mm square footprint 100 on the surface of the wafer. Thus, the entire surface area of the wafer 242 is covered by the 201 columns. Within each column there are 32 beams 220, produced by 32 field emission electron sources 202 in the column (described below). The 32 beams are 1.6 $\mu$m apart from each other on the wafer 242, and are simultaneously scanned along the X-direction (as shown in the axes 510 in FIG. 5). Each pixel is 25 nm×25 nm, and deflectors scan 64 pixels on the wafer to create a 1.6 $\mu$m-wide substripe (as shown in FIG. 4e). Since the beamlets 220 begin the scan on 1.6 $\mu$m centers, and all the beamlets scan the 1.6 $\mu$m substripes simultaneously, this creates a solid line on the wafer 242 that is 1 pixel wide and 51.2 $\mu$m long.

The writing strategy incorporating stage motion is shown schematically in FIGS. 4a–4e. The schematic diagrams in FIGS. 4a and 4b show the wafer 242, the column footprint 402 for each column, the 32 beams 406 within each column, and the stripes 414 written by the 32 beams. FIGS. 4c–4e show increasing magnification of the stripe 414 written by 32 beams 406 and the substripe 410 written by a single beam. The stripe 414 is the area scanned by all 32 beams 406 and extends across the whole length of the column footprint 402. The substripe 410 is the area scanned by a single beam and extends across the whole length of the column footprint 402. Thus, the stripe 414 is 51.2 μm in width×20 mm long, and is composed of 32 substripes 410, which are 1.6 μm in width×20 mm long. The width of each substripe 410 is composed of 64 writing pixels, each of which are 25 nm×25 nm. FIG. 4c shows a view of a single stripe 414, indicating the 32 individual substripes 410. FIG. 4d is a magnified view of FIG. 4c, and shows how each substripe 410 is composed of 64 writing pixels. FIG. 4e is a magnified view of FIG. 4d, showing the beam retrace during the writing of each substripe width.

Figure 5:
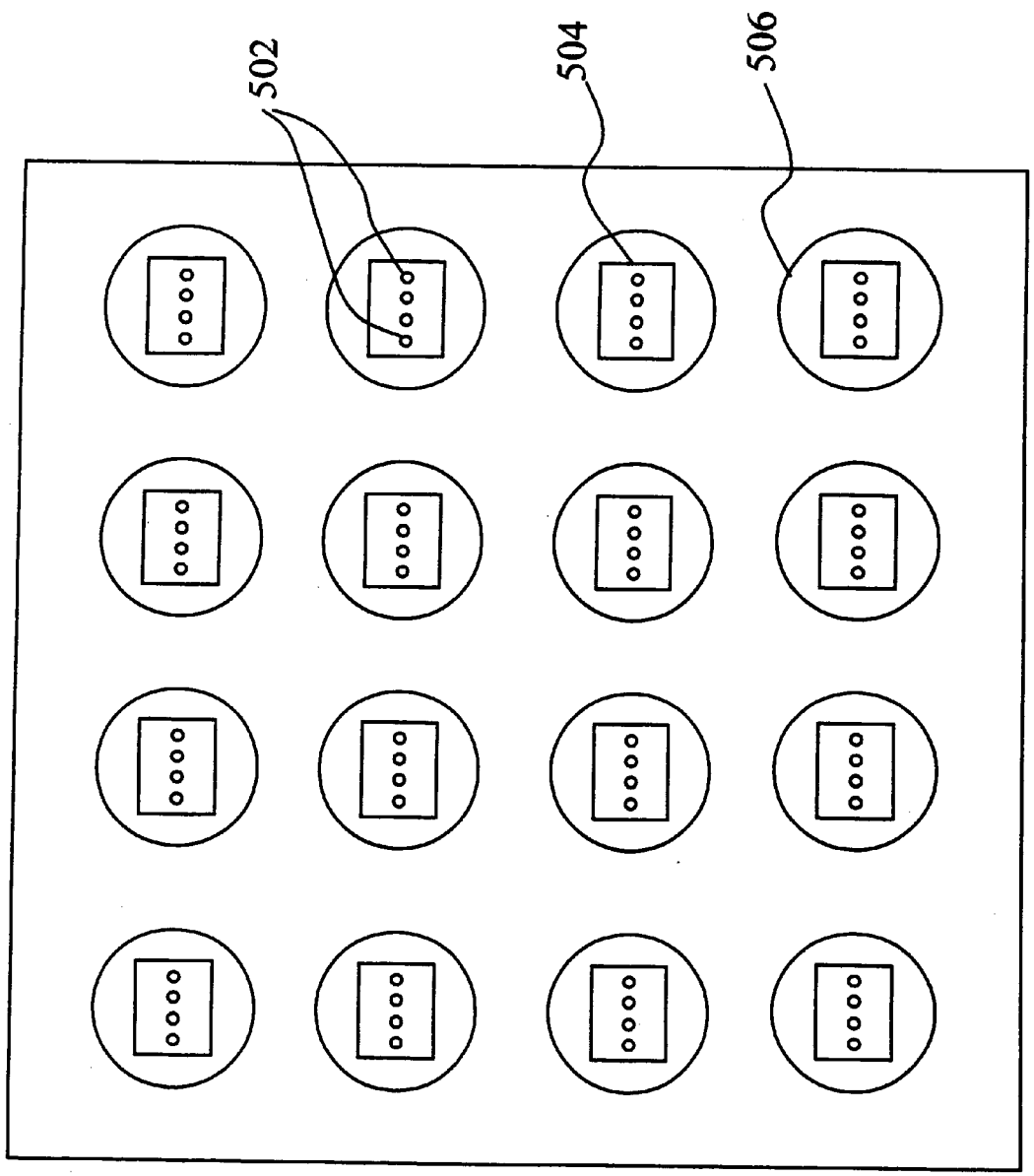
FIG. 5 shows a top plan view schematic of a 4×4 column array, indicating the tip array orientation and the motion of the stage.

FIG. 5, which shows a schematic 4×4 array of columns, each with 4 out of the 32 tips shown, is used to illustrate writing strategy and the synchronized stage motion. The individual tips 502 (4 out of 32), electron gun 504, column diameter 506, and X-Y axes 510 are shown. As can be seen, the tips 502 from all of the columns are aligned along the X-direction. Thus, the linear array of tips forms a linear array of spots on the wafer. The beams are scanned in the X-direction to fill in the area between adjacent spots on the wafer. The stage is scanned back and forth in the Y-direction. Referring back to FIG. 4, as the stage moves, the 32 beams 406 are simultaneously scanned in the X-direction to create a stripe 414 that is written across the 20 mm column footprint 402. As the stage scans across the entire footprint 402 of the column, the resulting cell stripe is 20 mm long and 51.2 μm wide that is drawn in the Y-direction corresponding to the stage motion. This can be thought of as a paint brush. As each column has 32 beams, then each column "paints" its own stripe 414. After completing one 20 mm pass across the column footprint, the stage steps the wafer 51.2 μm in the X-direction, and travels back across the column footprint 402 in the direction opposite to its first pass, as depicted in FIG. 4b. The column footprint 100 can also be seen schematically in FIG. 1. This process is repeated until the entire 20 mm×20 mm column footprint 402 is written with approximately 400 stripes 414. The wafer stage motion is called a serpentine motion (back-and-forth, writing both ways), covering the 20 mm square column footprint 402 with about 400 stripes 414 over a period of roughly 90 seconds. Since all of the columns are writing at the same time, this is also the time that it takes to write the whole wafer 242.

ELECTRON GUN—The position of the electron gun 250 within the optical column can be seen in FIG. 2. In standard terms, this is considered the "top" of the column (at the left of FIG. 2), and the wafer 242 is located at the "bottom" of the column (at the right of FIG. 2). Each column has its own electron gun 250 that consists of two primary components: the electron source and the aperture-deflector. In a preferred embodiment of the invention, both components are microfabricated on their own die, then flip-chip bonded together.

Figure 6:
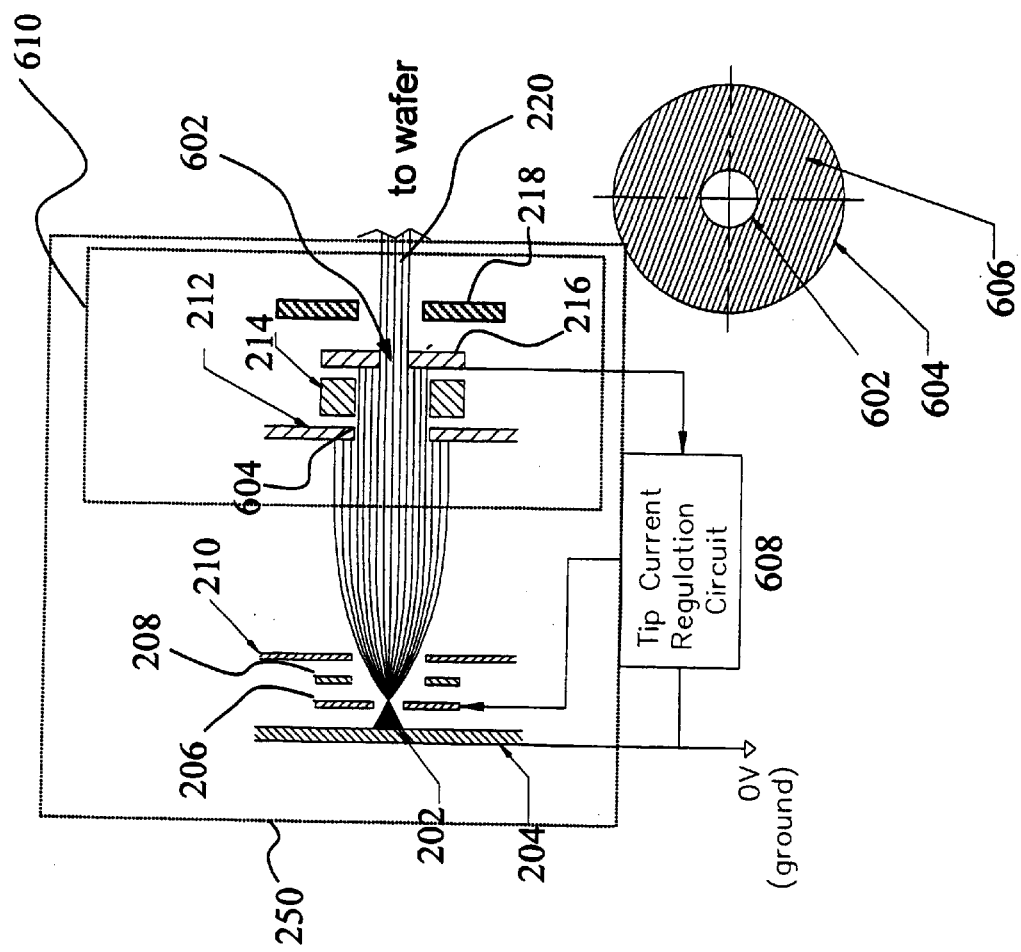
FIG. 6 shows a cross-sectional schematic of an electron gun, showing the current sense area and tip current regulation circuit.

FIG. 6 is a schematic of a single emitter and a single aperture-deflector element within the electron gun 250, showing the source substrate 204, field emitting tip 202, gate electrode 206, focus lens electrode 208, focus shield electrode 210, spray aperture 212, alignment deflectors 214, object aperture plate 216, blanking electrode 218, object aperture 602, tip current regulation circuit 608, current collection area 606 of the object aperture plate, and aperture-deflector assembly 610. An electron gun 250 in the preferred embodiment of the invention consists of 32 microfabricated Spindt-type field emitters arranged in a line with a center-to-center spacing of approximately 100 μm. The Spindt cathodes are fabricated on silicon wafers using well-known techniques [I. Brodie and P. Schwoebel, IEEE Proc., vol. 82, no. 7 pp. 1006 (1994)]. Various focusing 208 and shielding electrodes 210 may be added to the standard gated Spindt emitter, as discussed in U.S. Pat. Nos. 5,430,347 and 5,637,951. In one embodiment, each individual emitter has its own independently addressable gate 206 and focus electrodes 208. A voltage difference on the order of 100 V for a gate hole diameter of 1 μm is applied between the field emitting tip 202 (electrically connected to the source substrate 204) and the gate electrode 206 in order to extract electrons from the tip 202 into the vacuum by field emission. The focus lens electrode 208 is held near the potential of the tip 202 and focuses the resulting electron emission into a parallel beam. Typically, the potential applied to the focus electrode 208 must be a function of the potential on the gate electrode 206. The lens shield electrode 210 is used to eliminate crosstalk between adjacent electron beams 220, in case their operating voltages differ significantly. The lens shield electrode 210 could be continuous for the whole array of 32 emitters, or could be discontinuous, provided that all parts are held at the same potential. The lens shield electrode 210 is typically held at the average potential of the individual focus lens electrode potentials. These four elements—the field emitting tip 202, the gate electrode 206, the focus lens electrode 208, and the lens shield electrode 210—are all fabricated on the same source substrate 204.

In a preferred embodiment of the invention, the field emitting tips 202 (see FIG. 2) are held at electrical ground and the wafer 242 is held at high voltage (50–120 kV). High voltage is required because the electrons should have very high energy in order to reduce scattering within the resist on the wafer 242. Such scattering will blur the exposure and degrade writing resolution. In another embodiment, the wafer 242 is held at ground and the tips 202 are held at high (negative) voltage.

Another consideration is the minimization of capacitance of the multi-electrode cathode structure. A high capacitance is undesirable due to the RC time constant and stored energy (a large time constant will limit the frequency and rise time for the cathode's driving voltage, and a large stored energy can increase the occurrence of cathode failures due to arcing). The capacitance can be minimized by keeping the overlap and extent of electrodes to a minimum that is still consistent with their electron optical function.

Other embodiments include other types of microfabricated electron sources that can be integrated with the aperture-deflector 610 (see FIG. 6) and be suitable for the electron optical system described herein. Examples of these sources include, but are not limited to, single crystal silicon field emitter microcathodes with or without an emission enhancing coating on the silicon surface (e.g., metal, carbide or metal silicide coatings); and single crystal tungsten field emitters etched from a single crystal tungsten substrate—tungsten is attractive because it is the most fully characterized and best performing cathode known in the art of single crystal emitters used in field emission electron microscopes. It is considered that a charged particle optical system as described herein could be designed to work with ions. It may be possible that a microfabricated ion source can be integrated with the aperture-deflector 610, in a way that is similar to the description above for the electron source.

Referring to FIG. 6, after the electron beam is extracted from the tip 202 and focused into a parallel beam by the focus lens electrode 208, the electrons travel 100 to 500 μm and pass through the aperture-deflector assembly 610. The aperture-deflector assembly 610 for all 32 tips (only one of which is shown in FIG. 6) is fabricated on a single substrate and consists of the spray aperture 212, the alignment deflectors 214, the object aperture plate 216, and the blanking electrodes 218. The function of the spray aperture 212 is to provide a uniform accelerating region (between the lens shield electrode 210 and the spray aperture 212) and to block out all spherically aberrated beams from passing through the alignment deflectors 214. The spherically aberrated beams will not travel through the column with the correct trajectory and should not be allowed to pass through the object aperture 602.

The remaining electrons not blocked by the spray aperture 212 travel through the alignment deflectors 214 and to the object aperture plate 216, as shown in FIG. 6. The purpose of the alignment deflectors 214 is to steer the electron beams 220 into the blanking aperture 234 at the bottom of the electron optical column (see FIG. 2). This blanking aperture 234 is positioned at the back focal plane of the immersion lens 238, thereby minimizing aberrations. This will be discussed later. The alignment deflectors 214 shown in FIG. 2 and FIG. 6 actually represent an array of 32 alignment deflectors for each electron gun. There is one alignment deflector 214 for each field emission tip 202. The array of alignment deflectors 214 is a key feature of the electron gun 250 because it allows for precise positioning of a large number of parallel electron beams.

Figure 7:
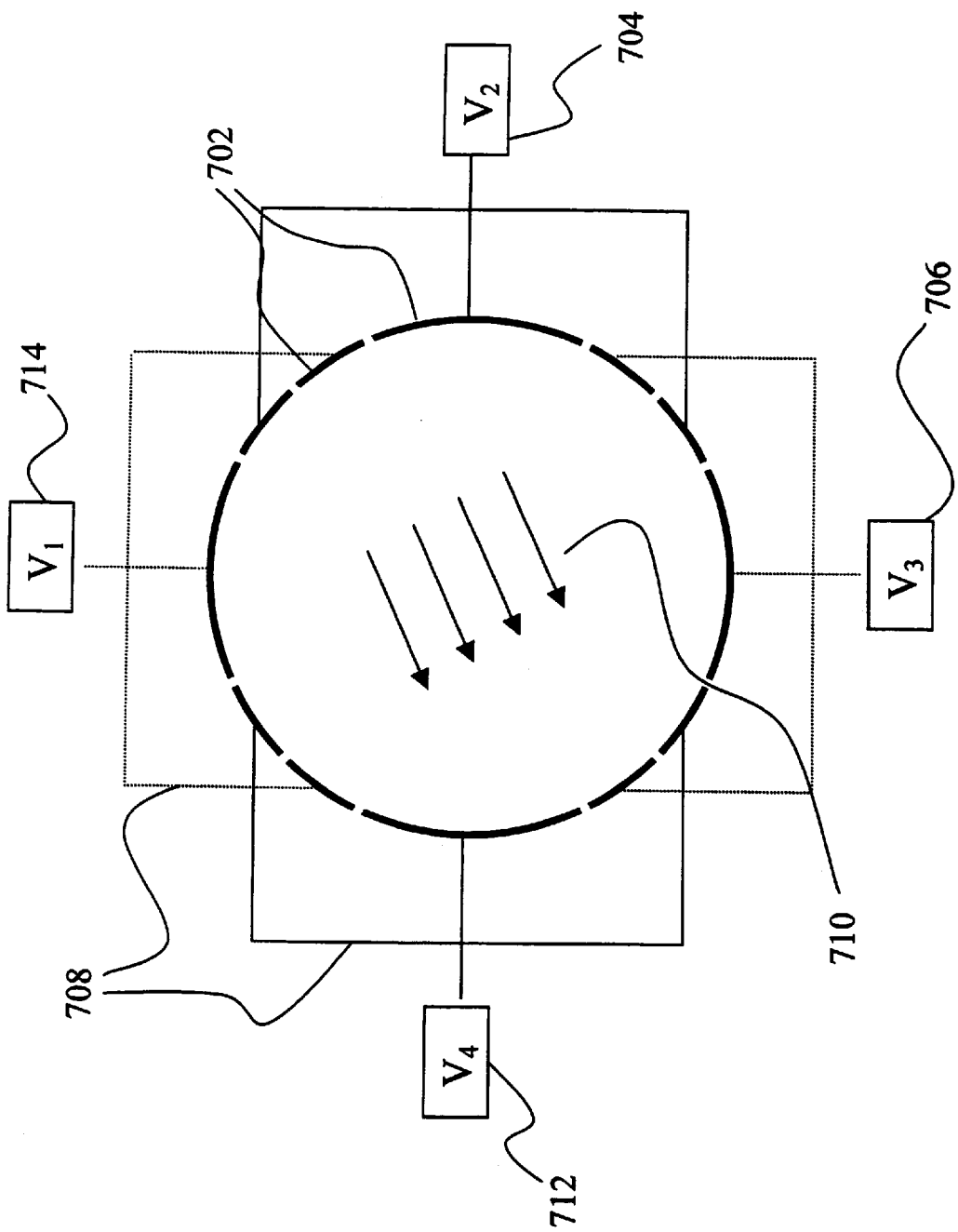
FIG. 7 shows a plan view schematic of a non-equisector dodecapole deflector.

The alignment deflectors 214 are a set of non-equisector dodecapole deflectors, as shown in FIG. 7. There are 12 poles (electrodes) for deflection, but the voltages on these poles are applied such that only 4 individual voltages are required. FIG. 7 shows the electrode arcs 702, voltages supplies 704, 706, 712, & 714, the electrical interconnects 708 between the electrodes, and the fields lines 710 formed within the beam region. The electrode arcs 702 have differing lengths. The electrode interconnects 708 are fabricated such that there are four sets of 3 electrodes. The interconnects can either be patterned directly onto the device, or can be connected externally. Each set of 3 electrodes is tied to a different voltage supply 704, 706, 712 & 714. Using the connections shown in FIG. 7, the non-equisector dodeacpole deflector deflects an electron beam with significantly reduced aberrations compared to a typical quadrupole [X-R. Jiang and Z-F. Na, J. Vac. Sci. Technol. B 5(1) (1987)]. The aberration coefficients are comparable to an octupole design, but a non-equisector dodecapole requires only 4 individual voltages 704, 706, 712 & 714 rather than 8 individual voltages. This significantly reduces the number of interconnects required in the aperture-deflector assembly 610. The drawback to using a dodecapole structure rather than an octupole structure is that the bore diameter should be somewhat larger in order to allow the formation of a uniform electric field 710 within the beam region. Also, the fabrication of the deflector electrodes 702 should be more precise in terms of mechanical tolerance. In the present embodiment, the inner diameter of the spray aperture 212 is 12 $\mu$m, the inner diameter of the dodecapole deflectors is 23 $\mu$m, the length of the dodecapole deflectors is 5 $\mu\mu$m, and the size of the object aperture 602 is 1.5 $\mu$m×1.5 $\mu$m. The combination of the individual tips 202, focusing electrodes 208, object apertures 602 and alignment deflectors 214 can be thought of as a "perfect lens". A perfect lens takes an incoming parallel beam and focuses the beam to a single point. The electron gun 250 creates a linear array of individual, parallel electron beams that can be independently focused to a single point (the blanking aperture 234, in this case), thus simulating a perfect lens.

In other embodiments of the alignment deflector, the alignment deflector 214 can be a quadrupole or an octupole. The quadrupole configuration has the same number of interconnects as the dodecapole configuration, and is easier to fabricate, but may introduce significant aberrations that increase the spot size at the wafer.

The octupole configuration has equivalent aberration effects compared to the dodecapole, but requires double the number of interconnects and power supplies.

Referring to FIG. 6, the object aperture plate 216 serves two purposes. First, the object aperture plate 216 is used as a current sense to regulate the current within the writing beamlet 220. This tip current regulation circuit 608 is shown schematically in FIG. 6. Each of the 32 tips 202 and focus lens 208 elements are individually addressable for the purpose of beam current regulation. The regulation circuit 608, which has a bandwidth of approximately 1 MHz, adjusts the voltage of the gate electrode 206 to control the current measured at the current sense plate 216. This sense plate 216 is positioned around the object aperture 802 for accurate determination of beam current passing down the column. This regulation circuit 608 has two additional functions: it can be used for high speed proximity effect correction by varying the programmed current, and is also used for noise reduction of the cold field emitter.

The second function of the object aperture plate 216, as shown in FIG. 6, is to define the object aperture 602, through which the electrons travel. All of the electrons passing through the object aperture 602 will hit the wafer 242 unless the beamlet 202 has been blanked. The optics of the electron optical column is such that the object aperture 602 is imaged on the wafer 242 with a demagnification factor. In the preferred embodiment of the invention, the object aperture 602 is 1.5×1.5 $\mu$m in size and the demagnification factor is $\frac{1}{60}$, resulting in a spot size of 25 nm×25 nm on the wafer 242, spaced 1.6 $\mu$m apart. In other embodiments of the invention, the object aperture 602 can be square or round, depending primarily on the writing strategy being employed (circular apertures work best with a multi-pass gray-scale printing technique, assuming that a Gaussian beam profile is generated; whereas a square aperture 602 will provide more current at the wafer 242 if throughput is to be maximized above other considerations and also provides the advantages of a shaped beam). In other embodiments, the object aperture 602 can range from 1 to 3 $\mu$m in diameter.

Figure 8:
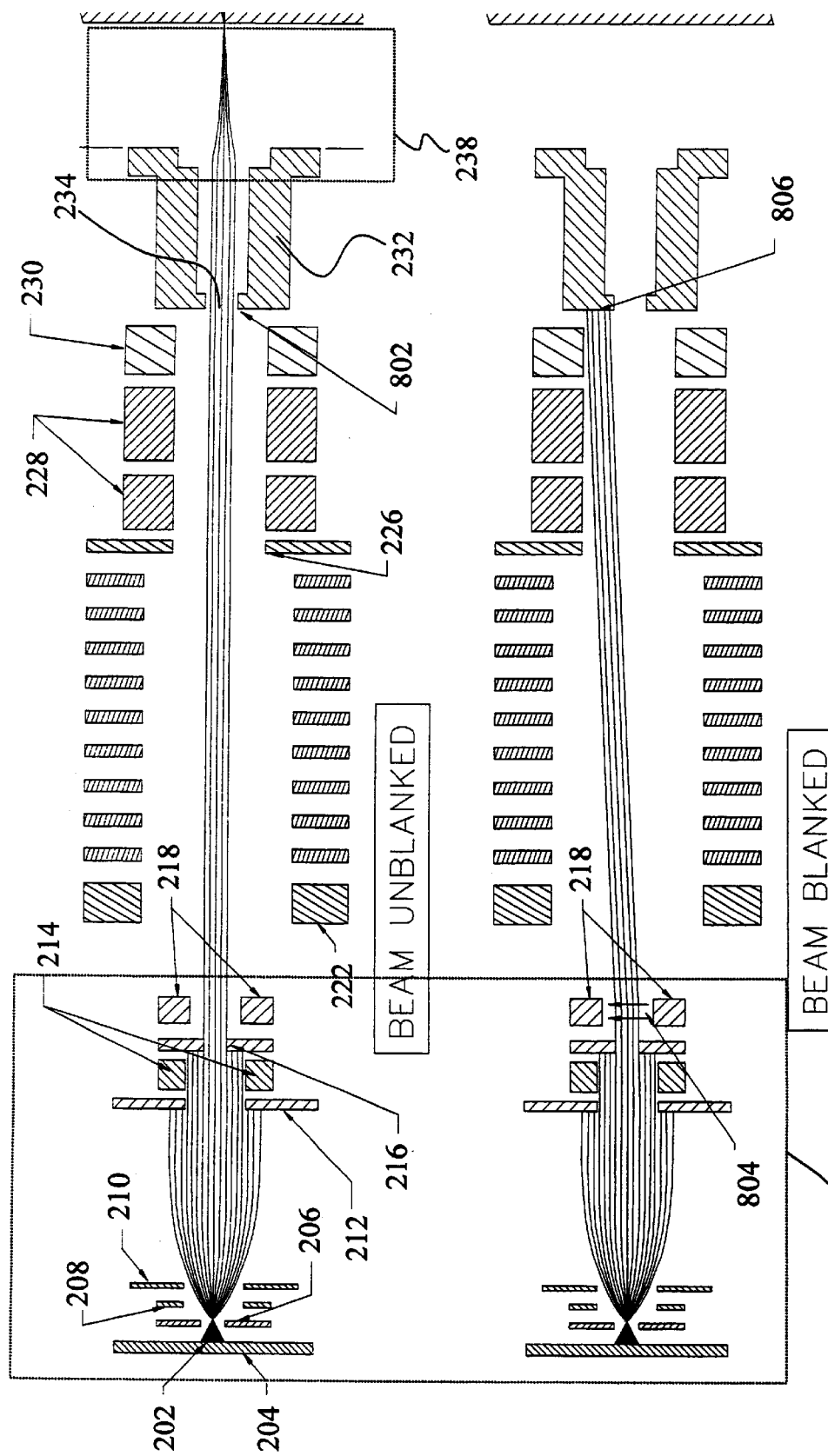
FIG. 8 shows a schematic diagram of how a beamlet is deflected off the blanking aperture using the blanking electrodes.

FIG. 8 depicts a schematic representation of the blanking process, showing the electron gun 250, beamlet 220, blanking electrodes 218, lens plate 232, wafer 242, beam location during writing 802, blanking field lines 804, and beam location during blanking 806. The blanking electrodes 218 consists of 2 parallel plates that are positioned immediately after the object aperture. When the potential difference between the blanking electrodes 218 is zero, the beamlet 220 is not deflected and can pass through the blanking aperture 234 and onto the wafer 242, assuming that the alignment deflectors 214 have been set so that the beam is steered into the blanking aperture. When a small potential difference is applied to the blanking electrodes 218, an electric field with electric field lines 804 forms between the blanking electrodes 218, and the beamlet 220 is deflected by the electric field. A one volt potential difference is sufficient to deflect the beamlet 220 off the blanking aperture 234 and onto the lens plate 232, as shown by the beam location 806 in the lower part of FIG. 8. The center tip is shown in FIG. 8, as evidenced by a perfectly horizontal beamlet. Off-axis tips at the source offer the same effect, but the beam is bent from its object aperture 602 position down to the blanking aperture 234, which is located exactly on the optical axis. The voltage required to blank an off-axis beam is the same as that for the on-axis beam. Because of the small voltages involved (1 V), the blanking bandwidth can be quite high. It is estimated that 250 MHz can easily be IS reached, and this is sufficient to allow for 30 wafers/hour writing throughput for a single multi-column, multi-beam writing head. The blanking of the beamlet 220 is performed in a manner called "conjugate blanking". This means that as the beamlet 220 is deflected by the blanking electrodes 218, the spot on the wafer 242 does not move. Conjugate blanking is desirable so that the image on the wafer 242 is not blurred during the blanking process. The reason that conjugate blanking has been achieved in this system is because the optics are imaging the object apertures 602 on the wafer, and the blankers 218 are at essentially the same position. Therefore, the actual image position does not change.

Figure 9:
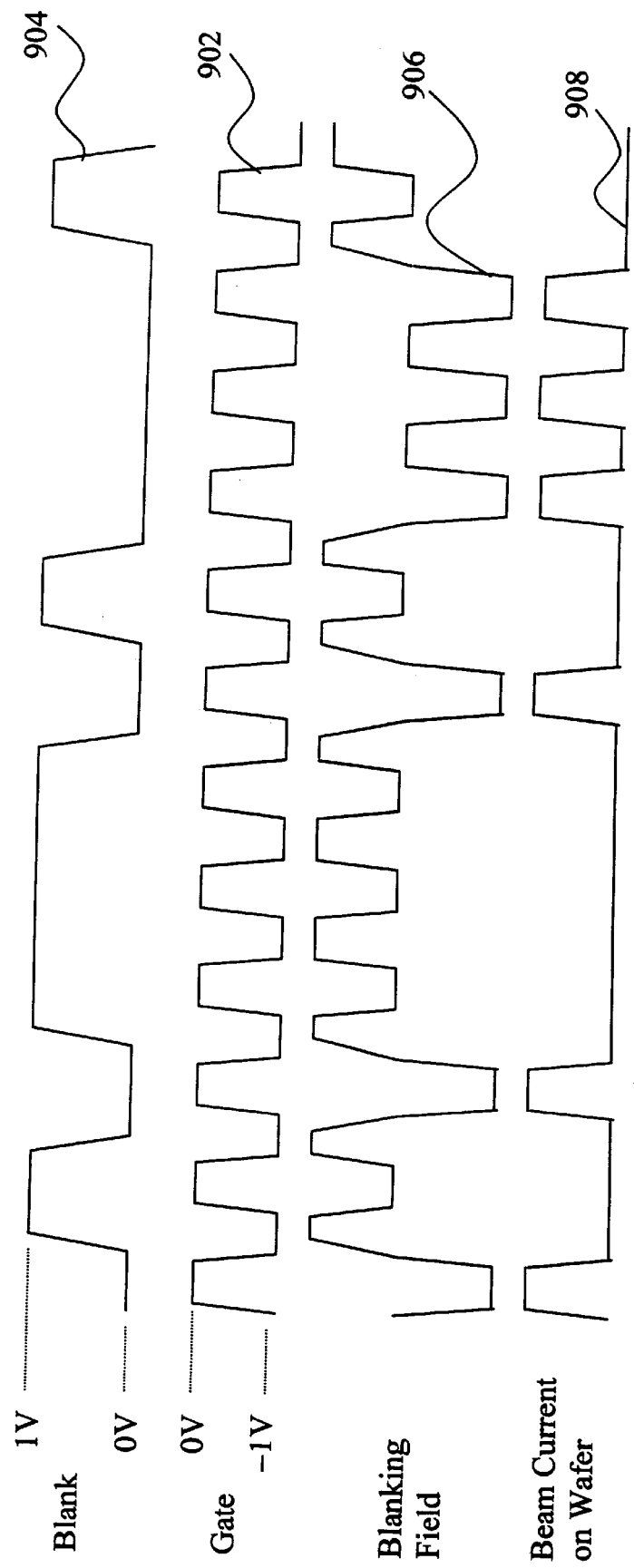
FIG. 9 shows plots of the blanking signal, gating signal, blanking field, and beam current on the wafer versus time, as required for blanking using the gated blanker approach.

In a preferred embodiment of the invention, the blanking of the beamlet 220 is performed in a gated manner. The plots of the blanking signal 904, gating signal 902, blanking field 906, and beam current 908 versus time are shown schematically in FIG. 9. A constant (periodic) square wave gating signal 902 is applied to one of the two electrodes that make up a set of blanking electrodes 218. This square wave has a frequency equal to the writing (or data) frequency, where the beamlet 220 is unblanked for only those portions of the gating signal 902 where the gating voltage is 0 V (about half of the gate period, as shown). This allows the beamlet 220 to pass through the blanking aperture 234 for only half of the time. The pattern data is then applied to the blanking signal 904, which is the potential applied to the second electrode in the set of blanking electrodes. The blanking field 906 is the magnitude of the electric field with electric field lines 804 (as shown in FIG. 8) between the blanking electrodes 218, and the beamlet 220 is unblanked only when blanking field 906 is at zero. The beam current 908 is the current that is writing on the wafer 242. As can be seen, the beam current 908 matches the applied blanking signal 904, indicating that the pattern data that is input into the blanking signal 904 is being correctly written on the wafer 242. The benefit of this system is that the rise and fall times of the blanking signal 904 do not significantly affect the beam deflection because they occur during an "off" state of the gating signal 902. The rise and fall times of the gating signal 902 can be made very small because the gating signal is a steady-state square wave signal. The disadvantage of this system is that the beamlet current 908 is only on the wafer 242 for half of the time, even when the pattern data requires an unblanked pixel. Therefore, in order to achieve the same writing dose, the beamlet current 908 must be double that of the typical writing current. In the previous calculation, a beamlet current of 12 nA was required for a throughput of 30 wafers/hr per writing head. Using this gated blanking system this beamlet current must be doubled to 24 nA.

Figure 10H:
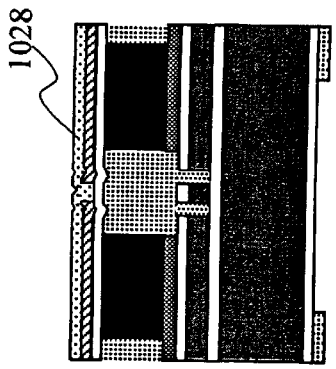
FIGS. 10a–10o schematically illustrate the fabrication sequence of an aperture-deflector assembly. All figures are schematic cross-sectional side-views of a single aperture-deflector structure.
Figure 10I:
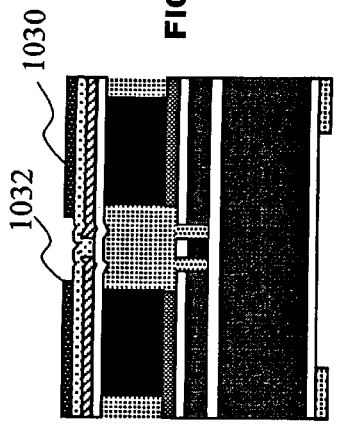
Figure 10J:
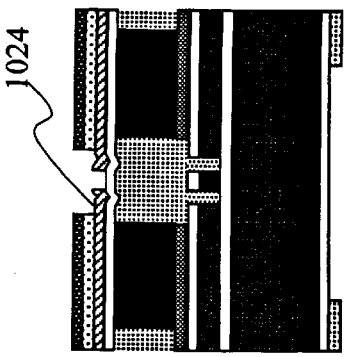
Figure 10K:
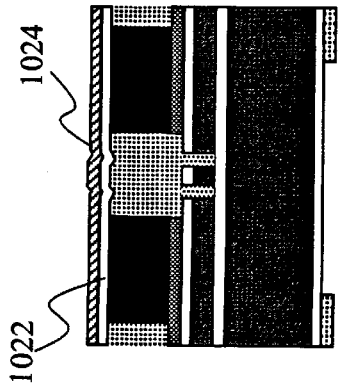
Figure 10L:
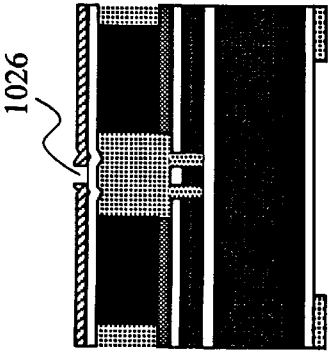
Figure 10M:
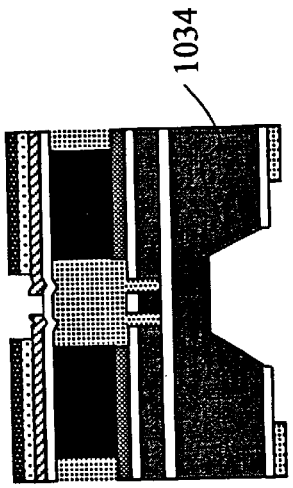
Figure 10N:
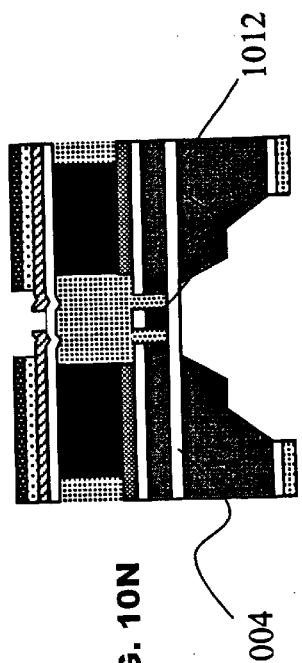
Figure 10O:
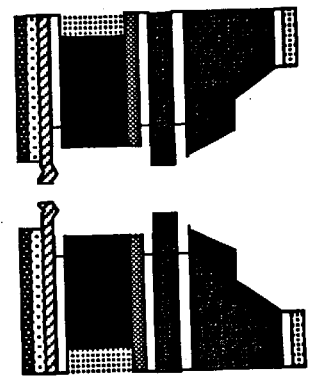

The fabrication of the aperture-deflector assembly is shown schematically in FIGS. 10*a*–10*o*. The process steps of this fabrication sequence are described below. Two alternative methods are described—the principal difference being the starting substrate.

Method A
1. Start with SOI (silicon on insulator) wafer—300 micron thick wafer 1002 with up to 2 $\mu$m of oxide 1004 on one surface, capped with 5 $\mu$m of Si 1006.
2. Grow 1 $\mu$m of thermal oxide or deposit 1 $\mu$m CVD oxide 1008 on both sides of wafer. FIG. 10*a*.
3. Lithography on topside followed by dry etch (RIE) through oxide 1004 and Si 1006 layers, defining a 12 $\mu$m diameter circular recess 1010 with a post 1012 in the center (the post 1012 serves to planarize the structure for future process steps). FIG. 10*b*.
4. Deposit 0.2 $\mu$m of silicon nitride 1014 on the backside; lithography on backside followed by dry etch (RIE) of nitride 1014. FIG. 10*c*.
5. Lithography on topside followed by evaporation of 40 nm of Cr followed by 0.5 $\mu$m of Au 1016. Liftoff excess metal. FIG. 10*d*.
6. Deposit (PECVD) a total of 5 to 8 $\mu$m of low stress SiO$_x$N$_y$ 1018 on the topside. FIG. 10*e*.
7. Lithography on topside followed by dry etch (RIE) through the SiO$_x$N$_y$, 1018 exposing the Au 1016. FIG. 10*f*.
8. Electroplate 5 to 8 $\mu$m of Au 1020 onto the exposed evaporated Au surface. FIG. 10*g*.
9. Deposit (PECVD) 1 $\mu$m of SiO$_x$N$_y$ 1022 onto the topside, followed by 0.3 $\mu$m of TiW 1024. FIG. 10*h*.
10. Lithography on topside followed by dry etch (RIE) of TiW 1024. This defines the object aperture 602; in different embodiments this aperture 602 may be 1.5 or 3.0 $\mu$m in diameter. FIG. 10*i*.
11. Deposit (PECVD) 1 $\mu$m of SiO$_x$N$_y$ 1028 on topside. FIG. 10*j*.
12. Evaporate or sputter (the latter provides better film continuity over steps) 1 to 1.5 $\mu$m of Al 1030 on topside. Lithography of the blanking electrodes 1032 on topside followed by wet etch of Al. FIG. 10*k*.
13. Lithography on topside followed by dry etch (RIE) of SiO$_x$N$_y$ 1028, exposing TiW 1024 layer. FIG. 10*l*.
14. Protect topside with photoresist (wafer may also be attached by wax to a glass plate); lithography on backside, followed by an etch with BOE (buffered oxide etch)—etching through the thermal oxide—followed by a KOH etch—etching crystallographically into the Si wafer 1034. FIG. 10*m*.
15. Strip photoresist from entire structure. Protect topside with photoresist and etch exposed backside thermal oxide with BOE, followed by a KOH etch—etching crystallographically into the Si wafer until the thermal oxide 1004 on the topside of the wafer is reached; alternatively a timed KOH can be followed by a dry (RIE) etch to reach the oxide 1004. FIG. 10*n*. Note: the Si post 1012 drops out during this step.
16. Continue with a BOE etch—etching the thermal oxide 1004 and SiO$_x$N$_y$ 1018 from the backside. FIG. 10*o*.

Method B
1. Start with a 300 $\mu$m thick Si wafer.
2. Grow 1 $\mu$m of thermal oxide or deposit 1 $\mu$m CVD oxide on both sides of wafer.
3. Lithography on topside followed by dry etch (RIE) through the oxide and approx. 10–20 $\mu$m into the Si, defining a 12 $\mu$m diameter circular recess with a post in the center.
4. Deposit 0.2 $\mu$m of silicon nitride on the backside; lithography on backside followed by dry etch (RIE) of nitride.
5. Lithography on topside followed by evaporation of 40 nm of Cr followed by 0.5 $\mu$m of Au. Liftoff excess metal.
6. Deposit (PECVD) a total of 5 to 8 $\mu$m of low stress SiO$_x$N$_y$ on the topside.
7. Lithography on topside followed by dry etch (RIE) through the SiO$_x$N$_y$, exposing the Au.
8. Electroplate 5 to 8 $\mu$m of Au onto the exposed evaporated Au surface.
9. Deposit (PECVD) 1 $\mu$m of SiO$_x$N$_y$ onto the topside, followed by 0.3 $\mu$m of TiW.
10. Lithography on topside followed by dry etch (RIE) of TiW. This defines the object aperture; in different embodiments this aperture may be 1.5 or 3.0 $\mu$m in diameter.
11. Deposit (PECVD) 1 $\mu$m of SiO$_x$N$_y$ on topside.
12. Evaporate or sputter 1 to 1.5 $\mu$m of Al on topside. Lithography on topside followed by wet etch of Al. This defines the blanking electrodes.

Figure 11:
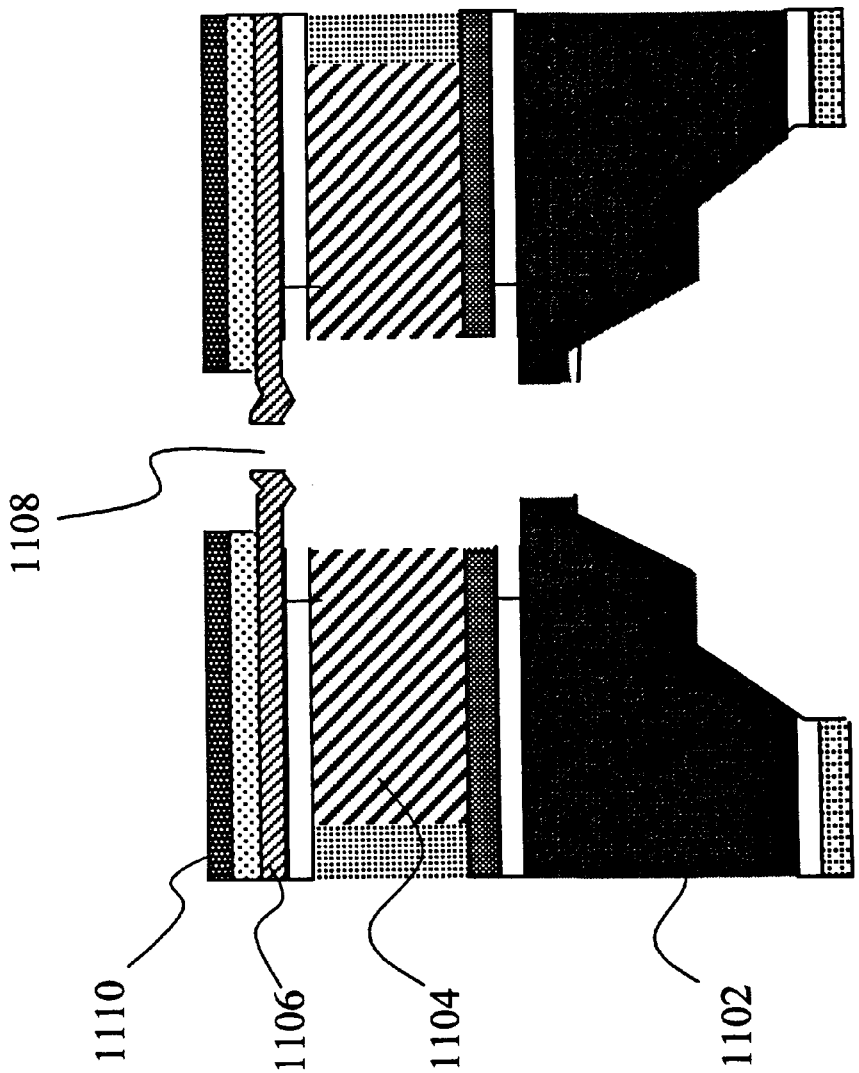
FIG. 11 shows a schematic cross-section of 3 out of 32 aperture-deflector assemblies on the aperture-deflector die.

13. Lithography on topside followed by dry etch (RIE) of SiO$_x$N$_y$, exposing TiW layer.
14. Protect topside with photoresist (wafer may also be attached by wax to a glass plate); lithography on backside, followed by an etch with BOE—etching through the thermal oxide—followed by a KOH etch—etching crystallographically into the Si wafer.
15. Strip photoresist from entire structure. Protect topside with photoresist and etch exposed backside thermal oxide with BOE, followed by a timed KOH etch—etching crystallographically into the Si wafer, followed by a dry (RIE) etch to reach the circular recess that was etched into the top surface at step 3 above.
16. Continue with a BOE etch—etching the SiO$_x$N$_y$ from the backside. FIG. 11.

FIG. 11 shows a schematic of a completed aperture-deflector using Method B, indicating the aperture substrate 1102, alignment deflectors 1104, object aperture plate 1106, object aperture 1108 and blanking electrodes 1110.

Figure 12:
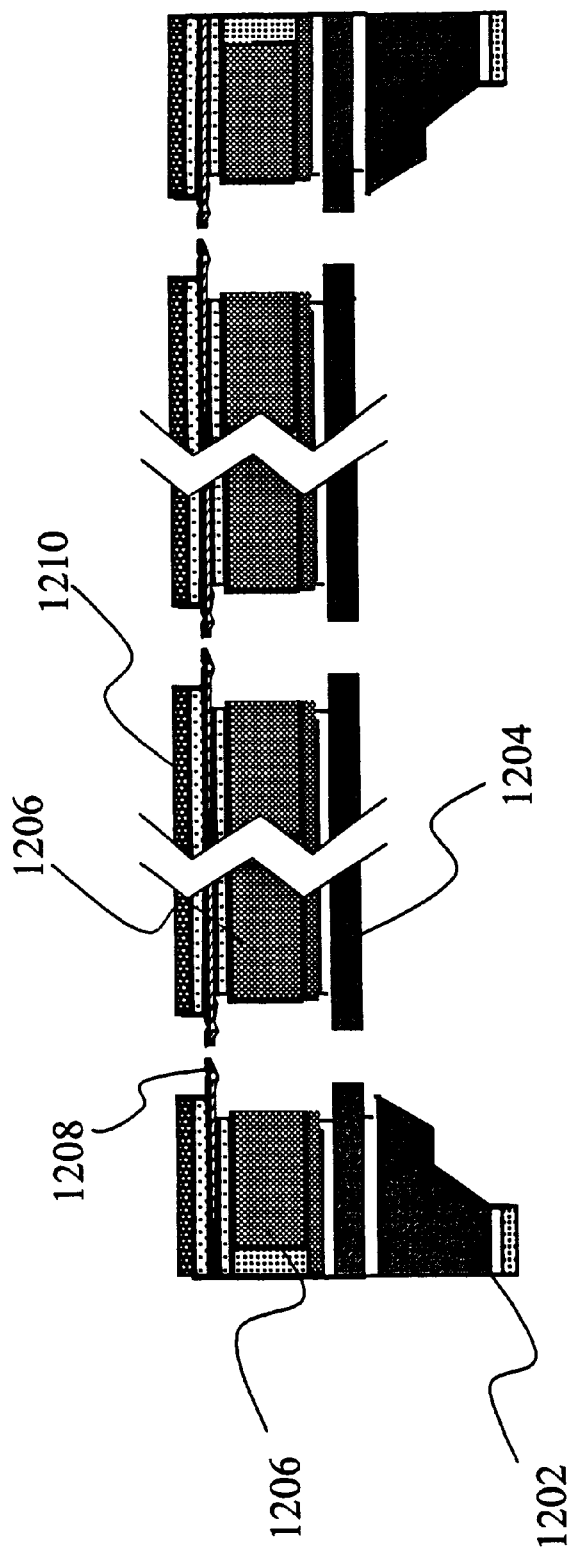
FIG. 12 shows a plan view schematic of the source die and aperture-deflector die, indicating the bond pads and silicon oxynitride insulating pedestals.

FIG. 12 schematically shows how adjacent aperture-deflector assemblies appear within the aperture-deflector device, indicating the substrate 1202, spray aperture 1204, alignment deflectors 1206, object aperture plate 1208, and blanking electrodes 1210. Only 3 out of 32 aperture-deflectors are shown. Each assembly is capable of individually deflecting an electron beam using the alignment deflectors 1206 towards the blanking aperture 234 (see FIG. 2), and provides an individual current sense (object aperture plate 1208) for source current regulation. Individual blanking is also provided by the blanking electrodes 1210. The details of the traces and contacts to the different electrodes are not shown. Various methods for laying out traces and making contacts, including the use of vias, would be familiar to anyone skilled in the art of semiconductor device fabrication. As can be seen in FIG. 12, the silicon substrate 1202 is etched beyond the aperture-deflector assemblies on the edges. Calculations indicate that this will not significantly affect the electron trajectories, although the spacing between edge of the device and the place where the substrate is etched should be as large as possible without compromising fabrication yield. A typical aperture-deflector substrate 1202 is 300 μm in thickness, and this represents the spacing between the field emission tip 202 (shown in FIG. 2) and the spray aperture 1204.

Figure 13:
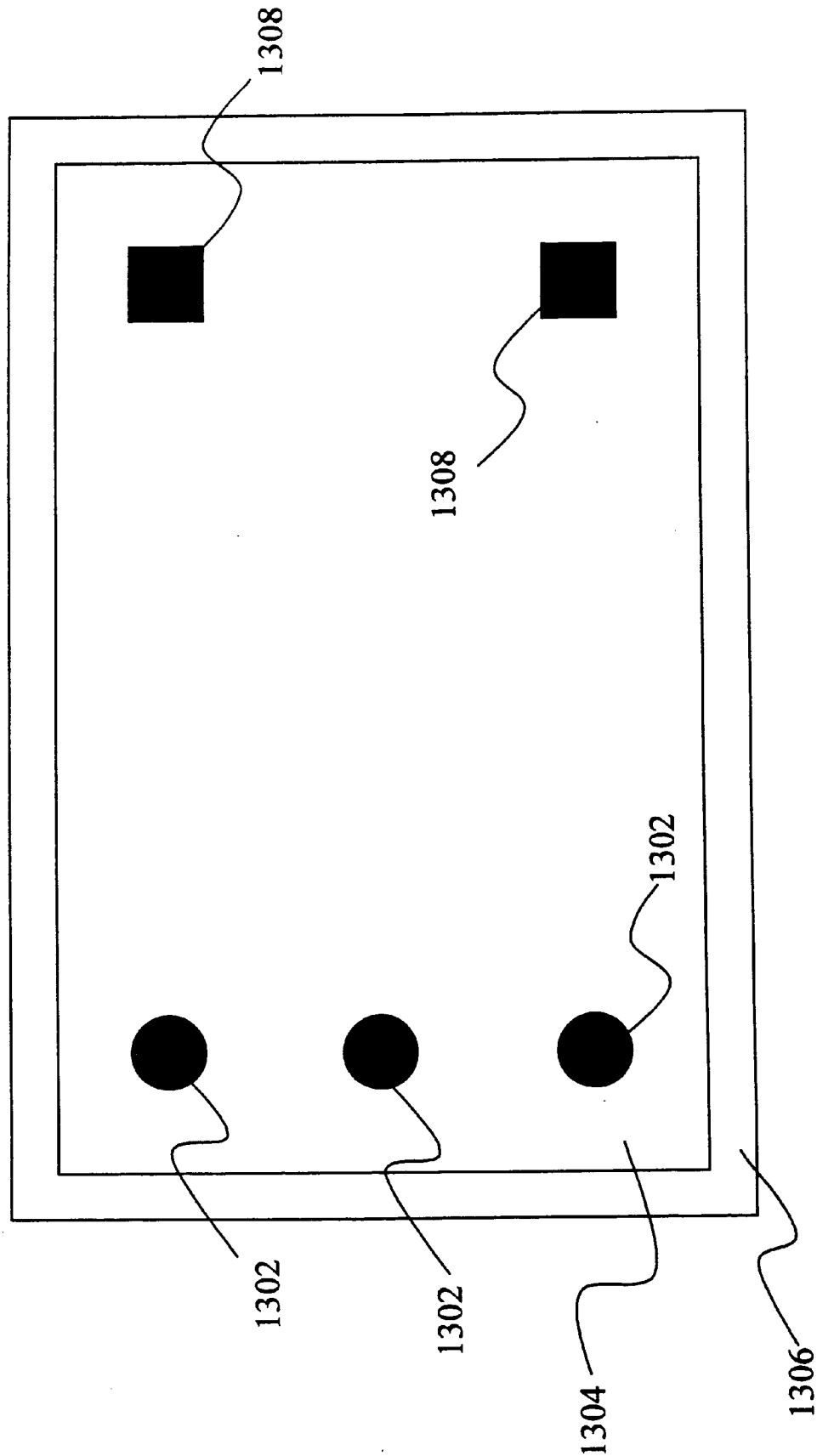
FIG. 13 shows a cross-sectional view of the source and aperture-deflector assemblies bonded together.

FIG. 13 is a schematic representation of the overlay of the aperture deflector die and the source die, showing the position of the gold bonds 1302, the aperture-deflector die 1304, source die 1306 and the silicon oxynitride pedestals 1308. The gold bonds 1302 are required on the source die 1306 to make a strong eutectic bond to the backside of the aperture deflector wafer 1304. The silicon oxynitride pedestals 1308 are required for electrical standoff between the two devices to prevent electrical shorting to the traces on the source die 1306. Note from FIG. 13 that the source die 1306 is larger than the aperture-deflector die 1304; this is to allow for ease of making electrical contacts to contact/bond pads on the top peripheral surface of the source die 1306. Electrical contacts are made to the top surface of the aperture-deflector die 1304.

Figure 14:
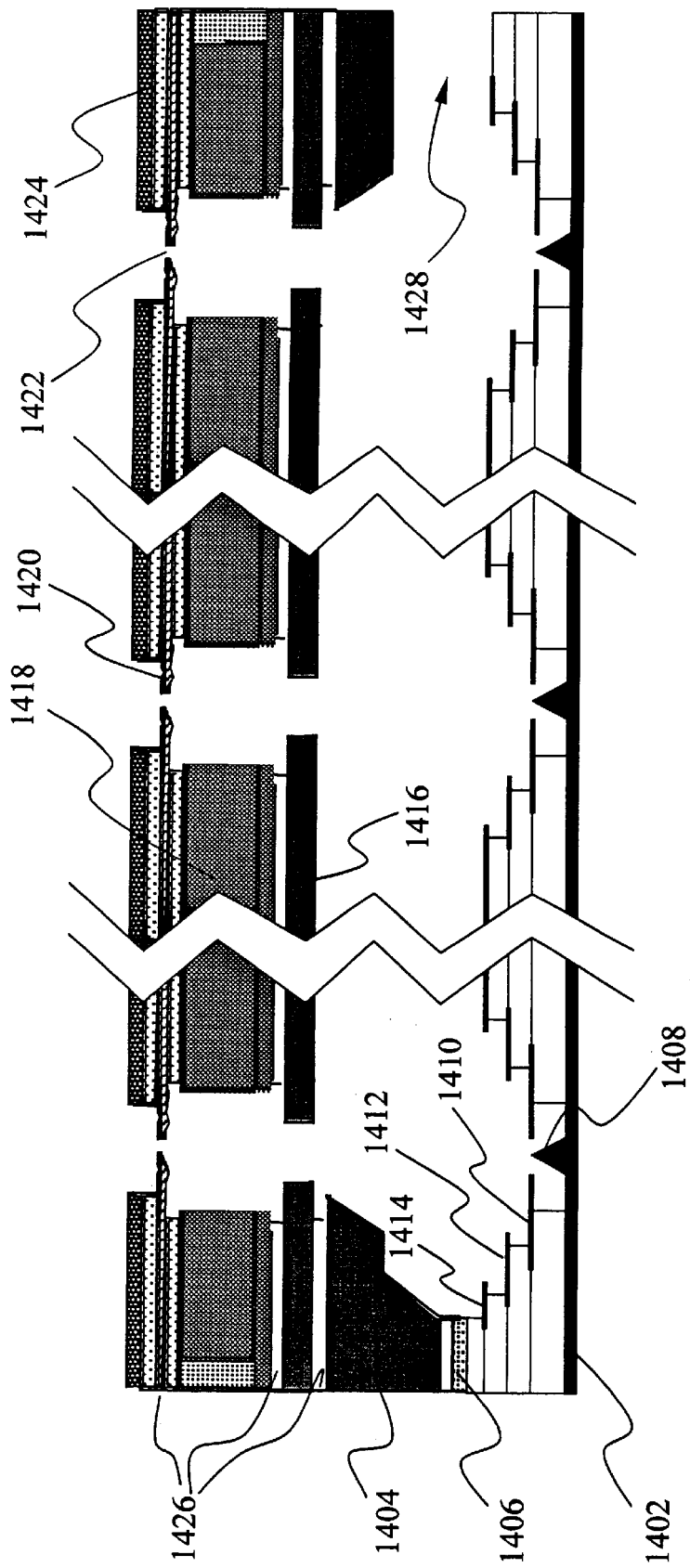
FIG. 14 shows an isometric view of the rotators acting on 5 out of 32 beamlets, and a schematic plan view of the rotator electrodes.

FIG. 14. schematically represents the entire electron gun after flip chip bonding, showing the source die substrate 1402, aperture-deflector substrate 1404, gold-silicon eutectic bond 1406, field emission tips 1408, gate electrodes 1410, focus electrodes 1412, lens shield electrodes 1414, spray apertures 1416, alignment deflectors 1418, object aperture plates 1420, object apertures 1422, blanking electrodes 1424, dielectrics 1426 and pumping aperture 1428.

Only 3 out of 32 sources are shown. The aperture-deflectors 610 (see FIG. 6) align with the field emission tips 1408 in this device so that the focused electron beam travels through the alignment deflectors 1418, object apertures 1422 and blanking electrodes 1424. Alignment tolerance is typically several μm. A pumping aperture 1428 is required in order to maintain a high quality vacuum environment at the field emission tips 1408. This allows improved performance and stability. The entire electron gun 250 (see FIG. 6) after flip-chip bonding of the two substrates is roughly 10 mm square. The electron gun will easily fit within the 20 mm square column footprint 100, while allowing the required interconnects. This electron gun 250 is typically brazed and wirebonded onto a ceramic header in order to conveniently make all the required electrical connections to the electron optical components. Note that in some embodiments, it may be preferred to reduce the spacing between the spray apertures 1416 and emitter tips 1408, in which case one or more of the following may be done: (1) thinner silicon may be used as a starting substrate 1404 for the aperture-deflector assembly 610, (2) the fabrication process may be modified to include thinning of the aperture-deflector substrate 1404 from the back at a later stage in the process flow.

Another embodiment of the aperture-deflector die includes a two dimensional array of aperture-deflector assemblies 610. As with the linear array, either discrete or large illumination area electron sources could be fabricated on one substrate and the aperture-deflector 610 could be fabricated onto a separate substrate that is flip-chip bonded onto the source substrate. Some lithography or imaging applications may benefit from writing a 2D array on the wafer rather than a linear array.

Another embodiment of the electron gun 250 uses a flood illumination source rather than discrete electron sources. In this embodiment, the part of the beam that passes through the object aperture 1422 can be individually controlled by the alignment deflectors 1418 to give a multiplicity of beamlets 220 traveling down the column.

ACCELERATION REGION AND DEFLECTORS—The accelerating and scanning deflector regions of the electron optical column represents the vast majority of the length of the column, as shown in FIG. 2, which is roughly 160 mm in a preferred embodiment of the invention. Due primarily to the small scale of the column, all of the lenses, rotators, deflectors, blankers, etc. are electrostatic; no magnetic optical elements are used. Concerns with magnetic elements are the complexities of the fabrication on such a small scale and magnetic screening of one column from the next in the closely packed array of columns. Most of the column components are precision-machined metals, insulating ceramics and conductive ceramics. Some of the more complex metal electrodes are screen printed onto ceramic; simpler electrodes maybe be brazed to ceramic. Standard mechanical and optical alignment techniques are utilized to ensure that all components are properly situated.

Referring to FIG. 2, after passing through the object aperture 602 and the blanking electrodes 218, the beamlet 220 enters the accelerating region. In the preferred embodiment of the invention, the electrons are accelerated from 100 eV to approximately 6000 eV, where the scanning deflectors are located. The acceleration can be accomplished using simple plates 224 on the order of 25 to 250 μm thick with holes corresponding to the accelerating column bore. These plates are typically metal, and can be made from beryllium copper or any other non-magnetic material. Typical column bores are 10 mm. The applied potential of each plate 224 would increase linearly from the 100 V to the 6000 V potential. The accelerating column can also be made from resistive ceramic in one piece. A linearly increasing potential is desirable because it does not introduce lensing effects in the beam that could distort the beam shape. In another embodiment the plates can be replaced with mesh grids. In the preferred embodiment, each column does not have an individual accelerating region, but the accelerating region of all 201 columns of the writing head are combined into one unit. This unit can have plates 224 extending across the whole area of the wafer, with holes for the individual columns.

Figure 15:
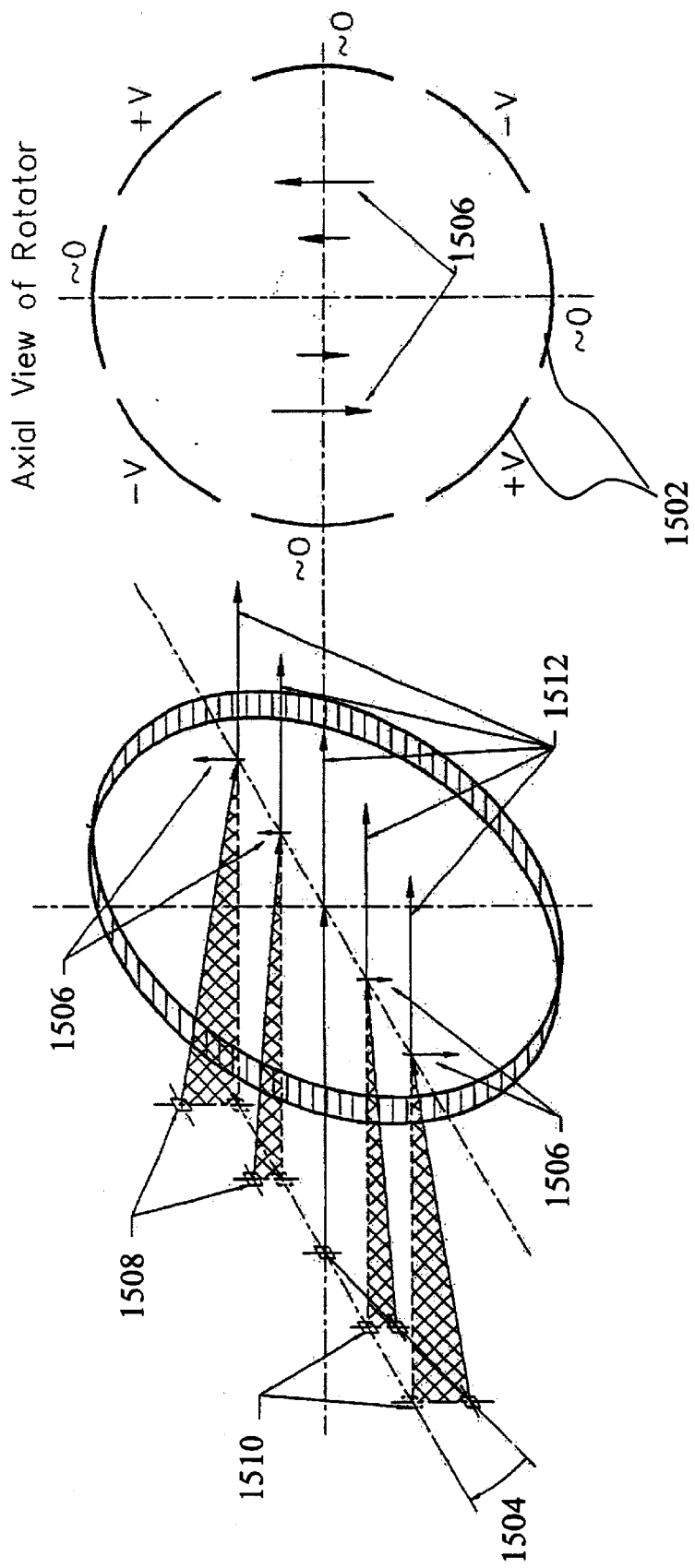
FIG. 15 shows a schematic diagram of how a beamlet is double deflected onto the wafer by the mainfield deflectors.

FIG. 15 is a schematic representation of the Rotator 222 (see FIG. 2) and its effect on the beamlet, showing the octupole deflector electrodes 1502, source rotation angle 1504, force vectors on the beamlets 1506, actual object aperture locations 1508, virtual object aperture locations 1510, and final trajectories of the beamlets 1512. Only 5 out of 32 beamlets are shown. The Rotator is the first electrode of the accelerating region, and in one embodiment, the electrodes are screen-printed metallic films on top of a ceramic substrate. The Rotator serves two purposes. First, the dc potential of the deflector electrodes defines the beginning of the accelerating region. This voltage is approximately 200–300 V. Second, the rotator deflector acts as a meridional plane rotator to correct for rotational misalignment of the source 1504 relative to the rest of the column. This function is necessary in a multi-column arrangement as mechanical rotational misalignments 1504 cannot be corrected using the scan. Normally, a magnetic lens is used to correct for rotation; however, it would be impractical to use 200+ magnetic lenses. To first order, an electrostatic quadrupole lens can perform this function as long as the beam rotation 1504 is not large. This is shown by the voltages applied to the electrodes in FIG. 15. It can be seen that by applying voltages to the octupole deflector 1502, force vectors 1506 will push one side of the 32 beamlets "up", while pushing the other side of the 32 beamlets "down". Assuming the amount of rotation 1504 is small, the force vectors 1506 are linear across the linear array of 32 beamlets 220. By bending the 32 beamlets 220 as shown in FIG. 15, the virtual object apertures 1510 are shifted away from the actual object apertures 1508 and appear as a rotational correction of the mechanical misalignment. The trajectories 1512 leaving the rotator make it appear that the object apertures are at the position of the virtual object apertures 1510.

As can be seen in FIG. 2, after passing through the accelerating region and being accelerated to roughly 6000 eV, the electrons pass through the shield electrode 226 and the mainfield 228 and subfield 230 scanning deflectors. The shield electrode 226 is the last electrode in the accelerating region and defines the start of the deflector region. It is typically a metal, metallized ceramic or conducting ceramic plate. The voltage on the shield electrode 226 and the dc voltage level on the subfield deflectors 230 are used to help focus the 32 beamlets 220 on the wafer 242. Varying the voltages will be used to correct for mechanical tolerance in the column length.

Figure 16:
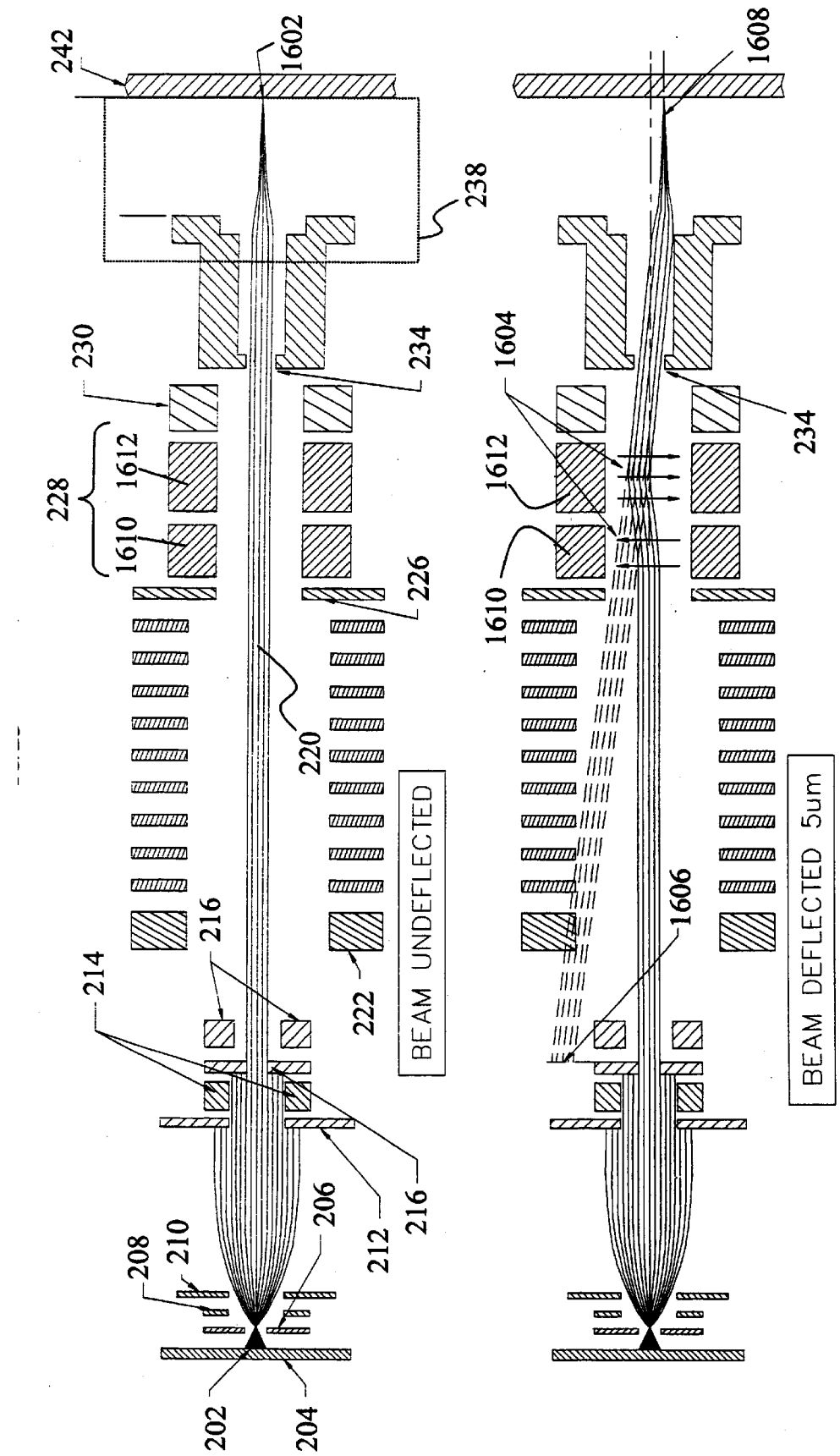
FIG. 16 shows a schematic diagram of how a beamlet is scanned on the wafer by the subfield deflector.

FIG. 16 schematically depicts the operation of the mainfield deflectors 228, showing the position 1602 of the undeflected beamlet on the wafer, the electric field lines 1604 formed during deflection, the displacement of the virtual object 1606, the deflected position 1608 of the beamlet on the wafer, the first octupole deflector 1610 and the second octupole deflector 1612. Only 1 beamlet out of 32 is shown in FIG. 16. In the preferred embodiment of the invention, the mainfield deflectors 228 are a set of double octupole deflectors 1610 & 1612. Therefore, there are 16 total connections to this deflector assembly. The mainfield deflectors 228 are fabricated using Ti alloy electrodes brazed to ceramic, which is useful for correctly spacing the deflector from the lens plate. Machining of the column bore is done after brazing, so as to ensure concentricity of both sets of octupole deflectors. The mainfield deflector 228 acts on all 32 beamlets 220 simultaneously. Two octupole deflectors 1610 & 1612 are used in order to ensure that the beamlets 220 pass through the blanking aperture 234 and are telecentrically scanned on the wafer 242. Telecentric scanning means that the beamlets 220 hit the wafer 242 perpendicular to the wafer surface, and this allows for a larger depth of field of the focused beam at the wafer 242. By using the double octupole design, the first octupole 1610 "pushes" the beamlet 220 in one direction, then the second octupole 1612 "pulls" the beamlet 220 in the opposite direction. Therefore, all 32 beamlets can pass through the blanking aperture 234 at the appropriate position and will scan telecentrically on the wafer 242.

The mainfield deflectors 228 have three function: (1) correct for mechanical misalignment of the column assembly, (2) track the stage motion as it moves the wafer 242 during writing, and (3) perform a large area scan to find alignment marks. The mainfield deflectors 228 have a total deflection capability of approximately ±10 $\mu$m in both the X and Y directions on the wafer 242. However, at the edges of this scanfield, the aberrations in the beam are significant, and beam resolution and spot size will be affected. Modeling of beam resolution and spot size has been carried out using the commercially available software packages SIMION 3D, ver. 6.0 and Eric Munro's MEBS. These calculations indicate that the writing field, within which the spot size is sufficiently small to expose a single pixel area, is approximately ±5 $\mu$m in X and Y for the mainfield deflectors 228.

In its first function, the mainfield deflectors 228 are used to correct for X-Y mechanical misalignment of the electron gun 250 with respect to the rest of the column. This misalignment is unavoidable due to assembly errors, and the electron gun assembly 250 may be as much as 25 $\mu$m offset from the rest of the column. Due to the ⅟₆₀ demagnification of the object apertures 602, this corresponds to less than a ±1 $\mu$m shift on the wafer 242. Thus, the mainfield deflectors 228 will be able to compensate for this assembly error. This error is fixed for the lifetime of the column.

In its second function, the mainfield deflectors 228 are used to track the stage motion during the writing process. A typical stage has a position accuracy of ±1 $\mu$m; however, since the pixel size is only 25 nm square, the position of the stage must be known to a much higher degree of accuracy. This information can be determined, for example, using laser triangulators. This spatial location information is fed in advance to the mainfield deflectors 228, which deflect all 32 beamlets 220 to the correct location of the wafer 242.

In its third function, the mainfield deflectors 228 are used to search for alignment marks on the wafer 242. This is achieved by scanning the full scan field (±10 $\mu$m square) to find the alignment marks. Global positioning should be sufficiently accurate to place the alignment marks within this scan field. Although the resolution or spot size of the beamlet 220 may not be as small as is needed for writing, it will be sufficient for the location of the alignment marks. The alignment marks are typically made using heavy atoms so that the backscattered electron efficiency of the mark is significantly higher than that of bare silicon (or silicon oxides). Therefore, the BSE detectors 236 will be able to detect the contrast between the heavy alignment marks and the areas with no marks. Typical alignment mark metals can be, but are not limited to, gold, tungsten, and titanium-tungsten.

The bandwidth of the applied voltage signal for the mainfield deflectors 228 is determined by the desired scan speed in order to find the alignment marks on the wafer. Typically, a bandwidth of roughly 50 kHz is more than sufficient for the mainfield deflectors 228.

Figures 17, 17A, 17B:
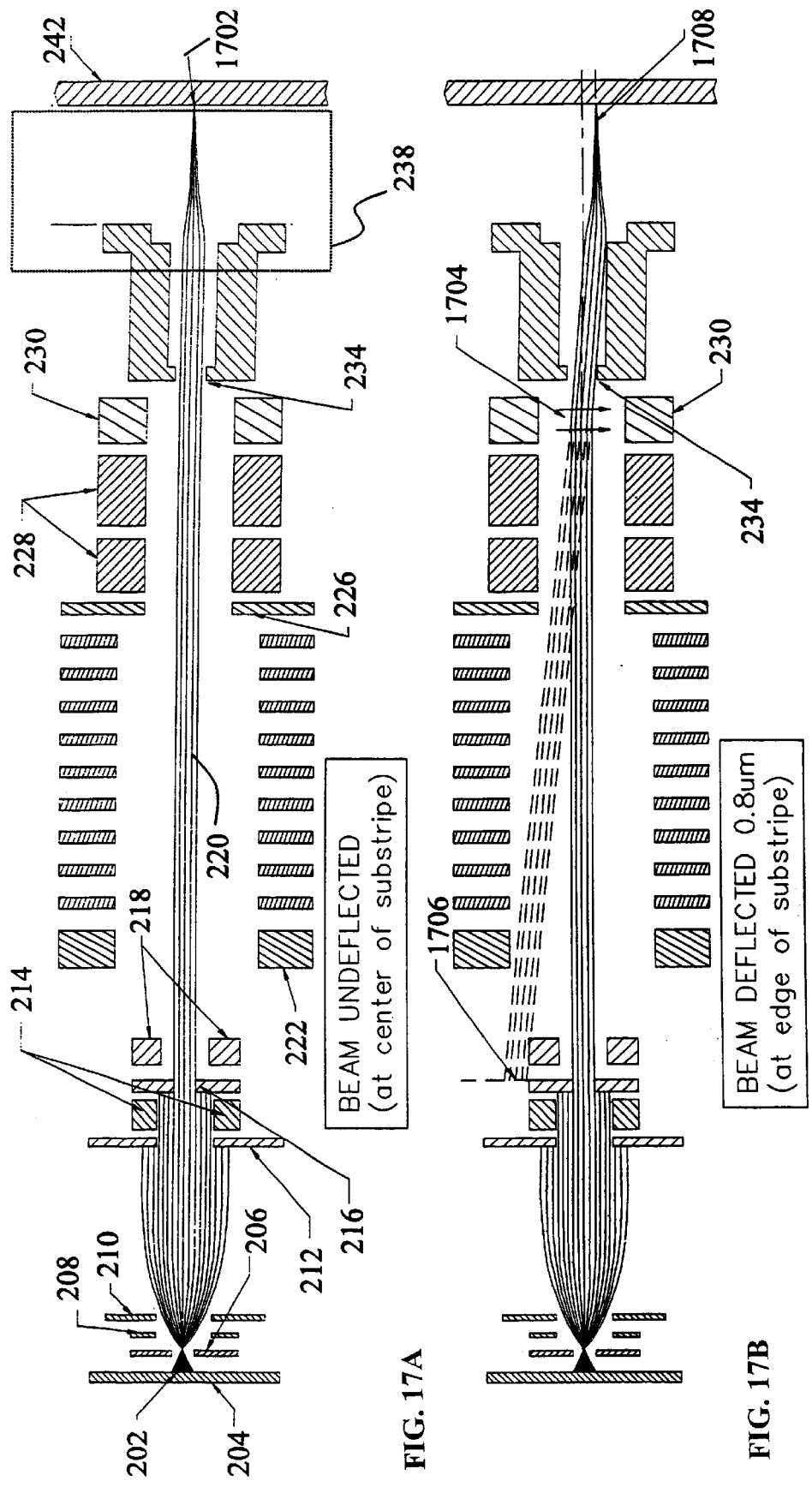
FIG. 17a shows a schematic representation of how pixels are written on the wafer, without stage motion correction using the subfield deflectors.
FIG. 17b shows a schematic representation of how pixels are written on the wafer, with stage motion correction using the subfield deflectors.

FIG. 17. schematically depicts the operation of the subfield deflectors 230, showing the position 1702 of an undeflected beam on the wafer, the electric field lines 1704 formed during deflection, the displacement of the virtual object 1706, and the deflected position 1708 of the beamlet on the wafer. Only 1 beamlet out of 32 is shown in FIG. 17. In the preferred embodiment of the invention, the subfield deflector 230 is a quadrupole deflector with 4 independent electrodes. An octupole deflector could be used; but since the deflection range of the subfield deflector is small (<±1 $\mu$m), the aberrations introduced by the quadrupole deflector do not significantly affect beam shape at the wafer 242. This has been confirmed using SIMION 3D, ver. 6.0 and Eric Munro's MEBS software package. A quadrupole has fewer connections, and therefore is preferable from a manufacturing point of view. In another embodiment of the invention, the subfield deflectors 230 could be octupole or higher order deflectors. The mainfield deflectors 228 are a set of double deflectors 1610 & 1612 in order to maintain telecentric scanning. The subfield deflector 230 only requires a single set of deflectors because the blanking aperture 234 is located very close to the subfield deflector 230. This allows a single set of deflectors to scan the beam through the middle of the blanking aperture 234 and achieve telecentric scanning on the wafer 242. This has also been confirmed using SIMION 3D, ver. 6.0. The subfield deflectors 230 are fabricated similarly to the mainfield deflectors 228.

The subfield deflectors 230, as seen in FIG. 17, serve two purposes. First, the dc voltage of the deflectors can be adjusted in order to achieve a small amount of focusing of the 32 beamlets 220 on the wafer 242. Ideally, if all of the columns were mechanically identical, this would not be necessary. However, since this is not realistic, the shield electrode 226 and subfield deflector 230 dc potential values are used to correct for minor adjustments in the focus and demagnification of the electron optical system. The second function of the subfield deflectors 230 is to scan the 32 beamlets 220 on the wafer 242 during the writing process. When the beamlets 220 hit the wafer 242 at any given time, the spots on the wafer 242 are roughly 25×25 nm in size, and are separated by 1.6 $\mu$m spacing. The subfield deflector 230 scans all 32 beamlets simultaneously in the direction parallel to the array axis (in the X-direction on FIG. 4) to fill in the space between the pixels. Therefore, the subfield deflector 230 only requires scanning of ±0.8 $\mu$m from its nominal position, corresponding to a total of 64 pixels between beamlets 220.

Although the subfield deflector 230 is only required to scan in one direction, a quadrupole deflector is required. There are two reasons for this: (1) rotational misalignment of the subfield deflector assembly with respect to the other parts of the column, and (2) slight changes in the deflection due to constant stage motion. A quadrupole deflector allows for a slight angle in the scan to correct for the rotational misalignment in the column. Most likely, the rotational misalignment will be small. The rotators can also be used to correct for some of this misalignment. The stage motion, however, dictates the use of a quadrupole deflector for the subfield deflector 230 rather than a simple dipole deflector.

The reason for this is illustrated in FIGS. 18a and 18b, which show a schematic of pixel locations on the wafer for uncorrected and corrected stage motion, respectively, including the scan 1802 of the beam on the wafer for uncorrected stage motion, scan 1804 of the beam on the wafer for corrected stage motion, stage motion 1806, scan direction 1808, substripe width 1810, pixel width 1812, and adjacent substripes 1814. Since the stage motion 1806 is continuous, the deflection of the beamlet 220 using the subfield deflectors 230 should compensate for this motion 1806. Otherwise, the end pixel of the beamlet will not match up with the beginning pixel of the adjacent substripe 1814, as shown in FIG. 18a. A very small correction should be applied to the deflection 1808 in the Y-direction to compensate for the stage motion 1806 during the writing of a single line so that the edges of the pixels match up to the adjacent substripe 1814, as shown in FIG. 18b. This correction signal requires at least a quadrupole deflector in order to fulfill the correction operation.

The required scan speed of the subfield deflector 230 from FIG. 17 can also be calculated. Assuming a blanking rate of 250 MHz and 64 pixels per scan, then the time required to scan the beamlets 1.6 $\mu$m across the wafer is 320 ns. Thus, a minimum bandwidth of approximately 3 MHz is required. However, in order to simplify the data path going to the blanking electrodes 218, it is desirable to do a retrace of the 32 beamlets 220 rather than writing the data in the reverse direction for every writing scan. Therefore, in the preferred embodiment of the invention, the bandwidth of the subfield deflector 230 is considerably higher than 3 MHz—typically approaching 100 MHz—in order to achieve a fast retrace to the next writing line to maintain a more simplified data sequence to the blanking electrodes 218.

IMMERSION LENS AND BSE DETECTORS—The bottom part of the column consists of the immersion lens 238 and BSE detectors 236, as shown in FIG. 2. The immersion lens 238 consists of the shape of the backside of the lens plate 232 and the region above the wafer. By applying high voltage (50 to 120 kV) on the wafer 242, a high field region is created between the wafer 242 and the lens plate 232 that focuses the 32 beamlets 220 onto the wafer 242 into 25×25 nm pixels, which is a 1/60 demagnification of the object aperture 602 array in the electron gun 250. The lens plate 232 is the last column component above the wafer. In the preferred embodiment of the invention, the lens plate 232 is common to all of the columns, and houses all of the BSE detectors 236 for all of the columns. The lens plate 232 is typically metal, and can be made of molybdenum, titanium, or any other non-magnetic material.

Figure 19B:
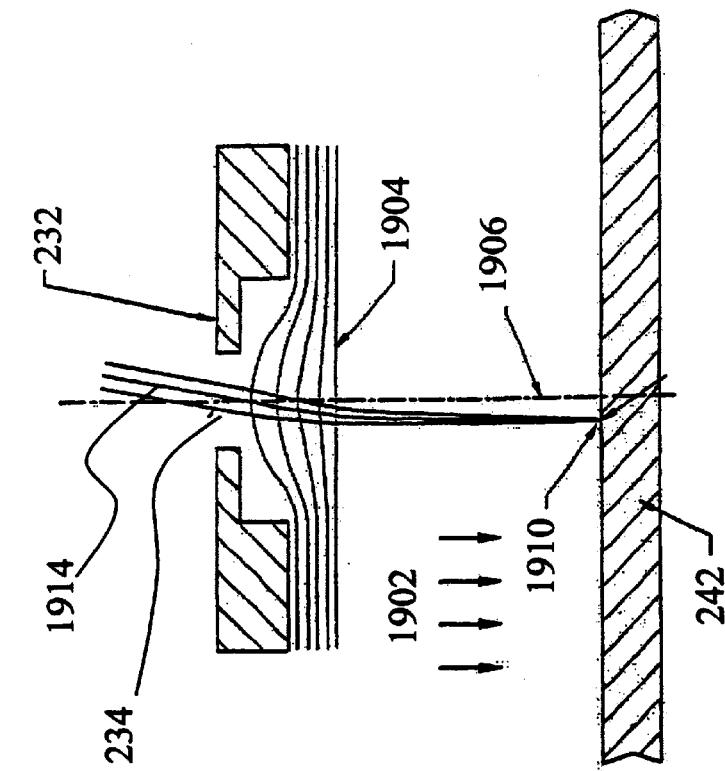
FIG. 19 shows a bottom plan view schematic of a 4×4 column array, indicating how the BSE detectors are mounted in the bottom of the lens plate.
Figure 19A:
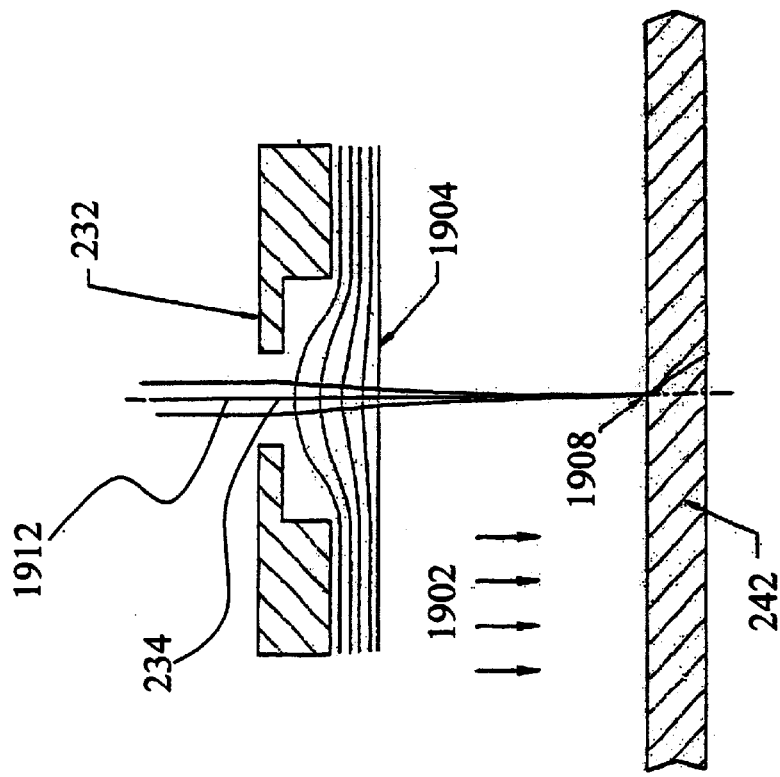

FIGS. 19a and 19b show a schematic representation of the immersion lens 238, showing the lens plate 232, wafer 242, blanking aperture 234, immersion field 1902, parallal equipotential lines 1904, curved equipotential lines 1906, centerline of the immersion lens 1906, location 1908 of the on-axis spot on the wafer, location 1910 of the off-axis spot on the wafer, on-axis beamlet 1912, and off-axis beamlet 1914. Only 1 beamlet out of 32 is shown. The lens plate 232 is precision-machined from a Ti alloy or Mo plate. In the preferred embodiment of the invention, the columns are positioned very accurately relative to each other by mounting all of them to a single precision-machined lens plate 232. The shape of the backside of the lens plate is important in creating the curved equipotential lines 1906. The electric fields corresponding to these equipotential lines 1906 focus the beam, as shown in FIG. 19, to a small spot on the wafer. Thus, the machining of these counterbore elements must be precise. The blanking aperture 234 is placed at the back focal plane of the immersion lens 238 to allow for telecentric scanning on the wafer 242, as shown in FIGS. 19a and 19b by the perpendicular trajectory of the beamlets 220 with respect to the wafer 242 during scanning. Telecentric scanning of the beam on the wafer allows for a larger depth of field at the wafer. Note that the blanking aperture 234 is placed in a field-free region so as to avoid a lens effect at this point in the column. In FIG. 19a, the on-axis beamlet 1912 travels through the blanking aperture 234 and is focused onto the on-axis position 1908 on the wafer 242. In FIG. 19b, the off-axis beamlet 1914 enters the blanking aperture 234 at a slight angle, and is focused on the wafer 242 at a slightly offset position 1910 compared to the on-axis beam position 1908. The beamlet 1914 in FIG. 19b could be one of several different types of beamlets: (1) an undeflected off-axis beamlet, (2) a deflected on-axis beamlet, or (3) a deflected off-axis beamlet. In all three of these cases, the beamlet 1914 will travel through the middle of the blanking aperture 234 and be telecentrically focused onto the wafer 242 at a position 1910 slightly offset from the on-axis beam position 1908.

In one embodiment of the invention, the distance between the lens plate 232 and the wafer 242 is roughly 10 mm. With a total column length of approximately 160 mm, this creates a 1/60× demagnification of the object apertures 602 in the electron gun 250. In a further embodiment of the invention, the distance between the lens plate 232 and the wafer 242 is roughly 20 mm. With the same column length, this creates a 1/30× demagnification of the object apertures 602. Differing demagnifications can be applied to different writing strategies, such as writing with shaped beams or gray scale writing. For example, a 1/30× demagnification with a round object aperture can be used to create a 50 nm Gaussian beam that can be used for a multi-pass, gray scale writing strategy.

Figure 20:
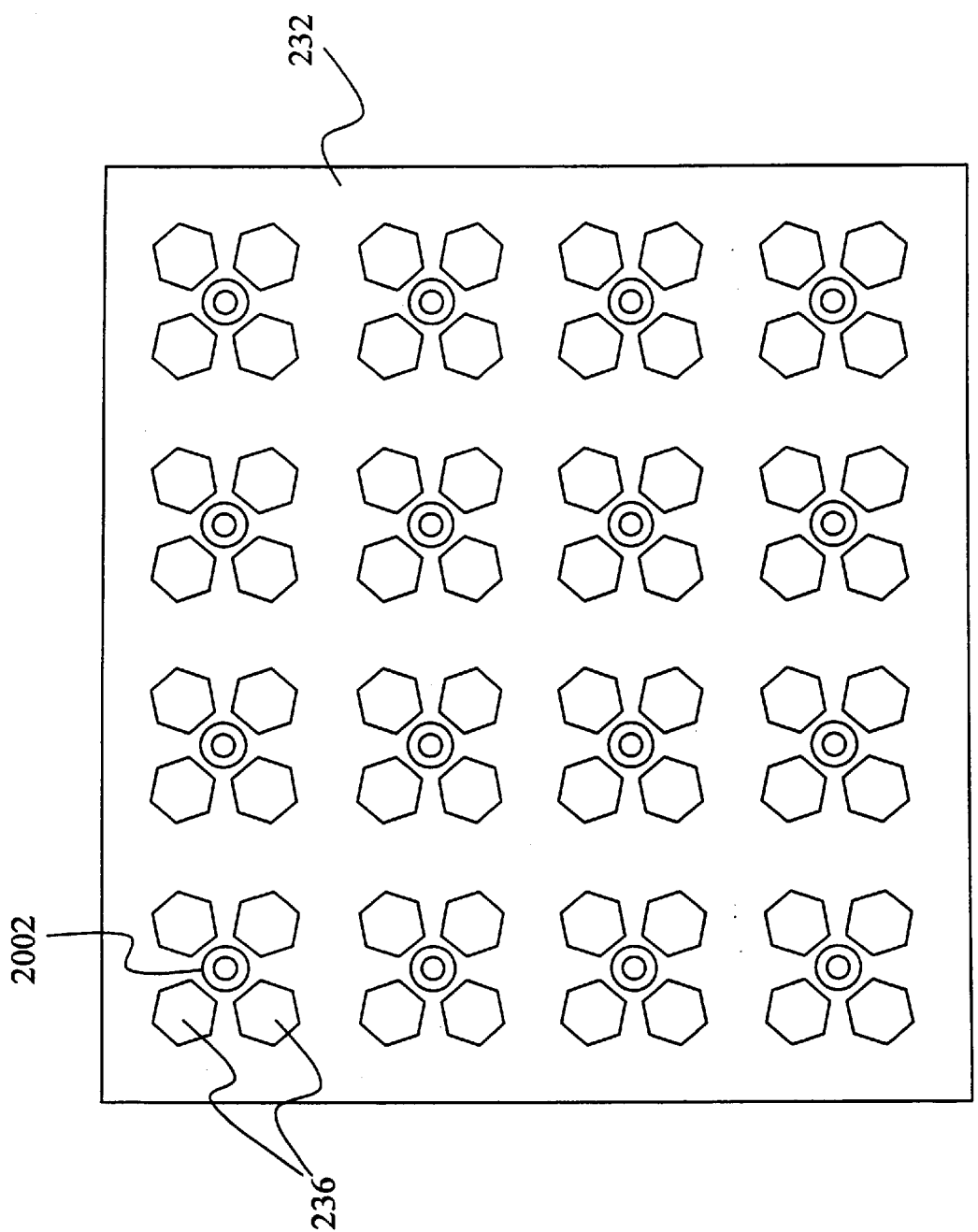
FIG. 20 shows a schematic cross-section of the column electron optical components and a block diagram of the column control electronics.

FIG. 20 shows a bottom plan view of a column array, showing the BSE detectors 236 within their housing in the lens plate 232 and the counterbore 2002 that bends the field lines in the immersion lens. Only 4×4 columns are shown out of the 201 columns within a writing head. As the beamlets 220 travel through the column and hit the wafer 242, as shown in FIG. 2, they create secondary and backscattered electrons 240 that are emitted from the wafer surface. Due to the high immersion field, the secondary electrons return back to the wafer. However, many backscattered electrons 240 will have sufficient energy to return through the immersion field and land on the BSE detectors 236. The BSE detectors 236 are housed in the bottom of the lens plate 232, and a high voltage bias (e.g., 1000 V) can be applied to ensure that the backscattered electrons 240 (see FIG. 2) reach the detectors 236 once they enter this housing. The opening in the lens plate 232 needs to be designed to allow maximum collection efficiency while shielding the detector 236 from the electric field of the immersion lens 238 (such a design may be similar to a wagon wheel in appearance—a circular opening with thin radial spokes, where care is taken to ensure that all edges are well-rounded so as not to generate high local electric fields). The BSE detectors 236 are an important feature in the invention because they will allow imaging of the wafer surface. This is particularly useful for alignment mark detection and global alignment of the wafer 242 with respect to the writing head. Because different materials have different backscattering coefficients, as the beamlets 220 are scanned on the wafer 242, the amount of backscattered electrons 240 reaching the BSE detectors 236 changes depending on the material that is hit by the electron beam. Typically during this scanning mode, only one beamlet 220 is used. By scanning the mainfield deflectors 228, an image of the wafer surface can be obtained using the BSE detectors 236, and alignment mark locations can be determined.

In the preferred embodiment of the invention, four individually controlled BSE detectors 236 are used, as shown in FIG. 20. Four individual BSE detectors 236 allow for collection of topographical information from the wafer surface. The BSE detectors 236 may include, but are not limited to, standard silicon detectors (optimized for electron collection).

The electron optical system is operated in a vacuum chamber with a pressure of at most 1 E–06 Torr, and preferably 1 E–08 Torr or less. The field emission electron sources are operated at a pressure of at most 1E–09 Torr and preferably 1E–12 Torr. The apertures in the column, such as the spray aperture 212 and particularly the object aperture 602 shown in FIG. 6 will act as differential pumping apertures, facilitating the maintenance of a better vacuum in the region of the electron sources.

Figure 21:
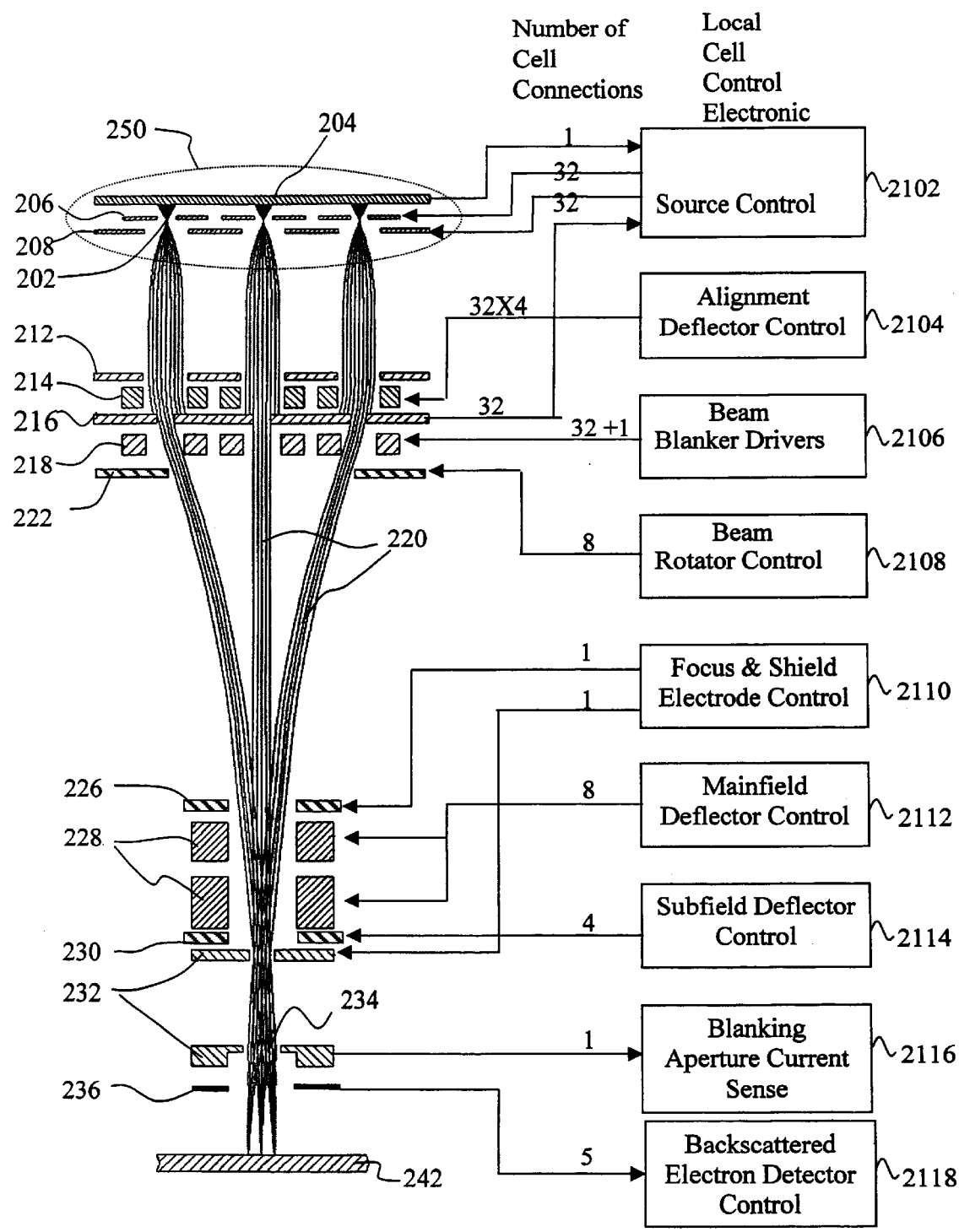
FIG. 21 shows the control electronics required to operate each electron optical column for the multi-column, multi-beam lithography system.

CONTROL ELECTRONICS AND ERROR ANALYSIS—The control electronics required to operate each electron optical column for the multi-column, multi-beam lithography system is illustrated in block diagram format in FIG. 21. The electron gun 250, field emission tip 202, source substrate 204, gate electrode 206, focus electrode 208, source control 2102, alignment deflector 214, alignment deflector control 2104, object aperture plate 216, blankers 218, blanker drivers 2106, rotator 222, rotator control 2108, shield electrode 226, shield electrode control 2110, mainfield deflectors 228, mainfield deflector control 2112, subfield deflector 230, subfield deflector control 2114, lens plate 232, blanking aperture current sense control 2116, BSE detectors 236 and wafer 242 are shown. The paragraphs below describe the control electronics and error analysis for the preferred embodiment of the invention.

Even if errors due to incorrect data being input into the blanking electrodes 218, or errors due to current fluctuations from the field emission tip, are zero, the possibility of writing errors due to operational failures or calibration errors in one of more of the 201 writing columns must be considered. The possible error sources in the column are as follows: the column components themselves, the column interconnects, and the column drive electronics. It is expected that the column drive electronics will be the most likely source of errors. The goal is to achieve a mean time between failures (MTBF) of over 10 years for the entire in-vacuum 201 column array.

The column drive electronics will consist mostly of analog and mixed signal D/A and A/D devices. As much of this electronics as possible will be located outside the vacuum environment in easily replaceable field-replaceable units (FRUs). However, the bulk of the critical column drive electronics will need to be located in-vacuum close to the column components to reduce the interconnect and feedthrough complexity. Most of the column data, control, and sense lines that enter the vacuum chamber will be multiplexed digital signals with error-correcting code (ECC) as required. It will be critical to have very high reliability of the in-vacuum components. The vacuum chamber provides a hermetic seal that should help reduce failures.

Published failures-in-time (FITs, where 1 FIT 1 failure/ $10^9$ hrs operation) numbers for analog and mixed signal devices vary widely depending upon the technology used. For the following calculations, a mature CMOS process has been assumed; CMOS is required to control power dissipation in the vacuum electronics. FIT numbers for these types of devices are around 5. TABLE 1 describes a rough estimate of the device count for the in-line vacuum drive electronics required for a single column. The calculations show an MTBF of approximately 6.3 years for the entire lithography writing head. A high level of integration (custom ASICs) is assumed.

TABLE 1

Internal device count and MTBF

| Sub-System | Internal Device Count per Column |
|---|---|
| Source control | 4 |
| Alignment deflector control | 4 |
| Blanker drivers | 1 |
| Rotator control | 1 |
| Shield electrode and HV control | 1 |
| Mainfield deflector control | 2 |
| Subfield deflector control | 1 |
| Current sensors | 2 |
| BSE detector | 2 |
| TOTAL | 18 |
| FIT @ 5/device | 90 |
| MTBF/column (years) | 1268 |
| MTBF/column array (years) | 6.3 |

The column can be subject to soft failures that can cause random wafer errors. These soft failures are "analog" in nature (data error rates can be made vanishingly small) and might be caused, for example, by a gain or offset drift in one of the deflection drivers. The self-detection of both hard and soft failures in the column array is a critical design requirement. The multi-column, multi-beam lithography tool will self-test the functionality of all columns, either continuously or at frequent intervals, to detect these errors and prevent yield loss. The paragraphs below will focus on how the self-testing operation can be performed. In this discussion, the interval between the self-test events is the shortest possible interval that can be achieved and still maintain full lithography system throughput.

The performance of the source can be monitored in three different ways: (1) The source stability is monitored continuously via the object aperture current sensors and source control electronics 2102. (2) During the wafer exchange time (every 120 sec), the source current can be monitored by unblanking all of the beamlets except the one of interest, and then measuring the current on the blanking aperture. The 32 measurements per column can be performed in parallel in all 201 columns, thus the overhead time can be kept to a few seconds (done in parallel with other tasks). (3) Once each hour or so, a Faraday cup calibration substrate is placed under the column array and the true wafer current for each beamlet is measured. The setpoint for the object aperture current servo is re-adjusted, if necessary, to the desired beamlet current.

The alignment deflector control 2104 provides dc deflection voltages to the alignment deflector plates. These deflection voltages steer the individual beamlets 220 into the blanking aperture 234. A failure in this controller 2104 will be detected within one wafer write time by Test (2) from above. Once each hour, the alignment deflector 218 operation will be completely verified and the setting re-adjusted so that the beamlets 220 are well-centered on the blanking aperture 234. This will be accomplished by sweeping the alignment deflector plate voltages in a raster scan over the blanking aperture 234 while measuring the blanking aperture current.

The blanker drivers 2106 are a set of 32 buffer gates between the data path and the physical blanking plates. The buffer gates are enabled at a bandwidth of approximately 200–250 MHz. Their operation is verified once each wafer write time by Test (2) from above. More sophisticated tests that measure the blanking plate rise time and fall time using stroboscopic techniques can be performed at less frequent intervals.

The rotator control 2108 provides signals to the rotator 222, which is an electrostatic octupole deflector requiring 8 voltage drive signals. Drive voltages are set only once during the calibration procedure performed during the initial system setup. The rotator setting can easily be verified at any time as long as an alignment mark is present on the wafer or a calibration substrate is mounted on the wafer chuck. This verification process involves finding the identical alignment mark using the two beamlets 220 at the edges of the 32 beamlet array. Any discrepancy in the X-axis mark location represents a rotational error in the beamlet array, which can be removed by adjusting the rotator voltages. This test can be performed on each rotator 222 approximately once each hour with no reduction in throughput.

The Focus and Shield Electrode Control 2110 applies high voltage signals used to bias the column stack 224 and to provide individual column focusing. These HV signals are common to all columns and are provided by an external HV supply that is fully instrumented to detect an out-of-tolerance condition. All power supplies in the lithography system will be continuously monitored and any out-of-tolerance conditions will be reported to the system controller. The shield electrode 226 provides an offset bias voltage for column focusing. Both the HV supply and the shield electrode supply will be verified once each hour in a focus check operation that involves loading a calibration substrate onto the wafer chuck. Reference edges on this substrate will be used to measure the beamlet size and adjust focus. Gross focus errors on the alignment columns would also be detected once each wafer 242 during the wafer alignment process.

The mainfield deflector controller 2112 supplies low frequency (<50 kHz) deflection voltages to the mainfield double octupole deflector plates 238 to compensate for stage positioning errors and the normal movement of the writing target under the beamlet 220 caused by stage movement during scan-line writing times. The verification of the mainfield deflectors 228 will be performed once each hour using a calibration substrate. This process involves a series of alignment mark location operations at different stage position. The alignment mark location should remain the same at all stage position values. Any systematic deviation from the ideal mark location as a function of stage position represents a deflection calibration error. Linear gain and rotation errors are easily measured and removed using this method.

The subfield deflector control 2114 provides 4 voltage signals to the subfield quadrupole deflector 230. Except for the blanking plate drivers, the subfield deflector 230 is the highest frequency device in the column. The subfield drivers provide the fast writing ramp deflection voltages to the subfield quadrupole plates. A preferred embodiment uses a single external writing ramp generator, with complete gain, offset and linearity monitoring. This ramp would then be broadcast to all 201 writing columns. The verification of the writing ramp at each column requires the use of stroboscopic beam blanking, since the BSE detector bandwidth is far below the writing ramp frequency. This verification process involves unblanking the beam repetitively at the same pixel number in the ramp and then executing a "find alignment mark" function. By unblanking the beamlet at the same point during the ramp, and executing a "find alignment mark" function at each point, it is possible to accurately measure the length, linearity, and orientation of the writing ramp at each column. The process is time consuming and could probably be performed only once each day without impacting throughput. On the other hand, it is possible to minimize the number of internal active components required in the subfield driver so that reliability is high.

The current sensors 2116 monitor the electron beam current at various column electrodes. Their operation can easily be verified during wafer exchange.

The BSE detectors 236 comprise 4 silicon PIN diodes, 4 analog pre-amplifiers, and 4 fast A/D converters. If topographical information is desired, there are 4 BSE detector output signals for each column. If topographical information is not desired, then there is only one BSE detector output signal for each column, representing the combined signals from the four BSE detectors 236. The BSE detectors 236 are critical for obtaining accurate wafer alignment on each written wafer. The operation of these detectors 236 will be verified once each hour on a calibration substrate containing alignment marks, which can be imaged by all 201 BSE detectors to both verify their operation and to check (and, if necessary, reset) the column X-Y centerline.

What is claimed is:

1. An electron optics assembly for a multi-column electron optical system comprising:

a multiplicity of separate electron sources, such that there is a corresponding electron source for each column;

a single accelerator structure situated below said electron sources;

a multiplicity of separate scanning deflectors situated below said accelerator structure, such that there is a corresponding scanning deflector for each column; and a multiplicity of focus lenses situated below said deflectors, such that there is a corresponding focus lens for each column.

2. An electron optics assembly as in claim 1, wherein each of said electron sources comprises a multiplicity of independently operable field emission cathodes.

3. An electron optics assembly as in claim 1, wherein said accelerator structure is comprised of a set of accelerator plates, a multiplicity of accelerator apertures extending fully through said set of accelerator plates, such that there is a corresponding accelerator aperture for each column.

4. An electron optics assembly as in claim 1, wherein said accelerator structure is comprised of a single piece of resistive ceramic material, a multiplicity of accelerator apertures extending fully through said single piece of resistive ceramic material, such that there is a corresponding accelerator aperture for each column.

5. An electron optics assembly as in claim 1, further comprising a multiplicity of alignment deflectors, for precisely steering the electron beams down the centers of corresponding columns, situated between said electron sources and said accelerator structure, such that there is a corresponding alignment deflector for each electron beam.

6. An electron optics assembly as in claim 1, wherein said multiplicity of focus lenses are formed in a single lens plate.

* * * * *